United States Patent
Boyd

(10) Patent No.: US 9,538,292 B1
(45) Date of Patent: *Jan. 3, 2017

(54) SPEAKER WITH VOICE COIL AND FIELD COIL

(71) Applicant: COLERIDGE DESIGN ASSOCIATES LLC, San Jose, CA (US)

(72) Inventor: Geoffrey A. Boyd, San Jose, CA (US)

(73) Assignee: Coleridge Design Associates LLC, San Jose, CA (US)

(*) Notice: Subject to any disclaimer, the term of this patent is extended or adjusted under 35 U.S.C. 154(b) by 27 days.

This patent is subject to a terminal disclaimer.

(21) Appl. No.: 14/622,837

(22) Filed: Feb. 14, 2015

Related U.S. Application Data

(63) Continuation-in-part of application No. 13/849,494, filed on Mar. 23, 2013, now Pat. No. 8,958,597.

(60) Provisional application No. 61/614,997, filed on Mar. 23, 2012.

(51) Int. Cl.
  *H04R 1/00* (2006.01)
  *H04R 9/04* (2006.01)
  *H03F 3/181* (2006.01)

(52) U.S. Cl.
  CPC ............ *H04R 9/04* (2013.01); *H03F 3/181* (2013.01)

(58) Field of Classification Search
  CPC .................................. H04R 9/02; H04R 9/06
  USPC .................................................. 381/400, 406
  See application file for complete search history.

(56) References Cited

U.S. PATENT DOCUMENTS

| | | | | |
|---|---|---|---|---|
| 4,220,943 A | * | 9/1980 | Wesson | H04R 21/02 338/155 |
| 5,642,333 A | * | 6/1997 | Imahori | B65H 54/58 29/609.1 |
| 5,761,317 A | * | 6/1998 | Pritchard | H03G 7/08 330/102 |
| 8,958,597 B2 | * | 2/2015 | Boyd | H04R 1/00 381/400 |
| 2003/0002691 A1 | * | 1/2003 | Ono | H04B 1/3838 381/94.1 |
| 2006/0210107 A1 | * | 9/2006 | Hyre | H04R 9/06 381/412 |
| 2010/0034418 A1 | * | 2/2010 | Bonin | H04R 9/025 381/396 |

* cited by examiner

*Primary Examiner* — Ahmad F Matar
*Assistant Examiner* — Katherine Faley
(74) *Attorney, Agent, or Firm* — Minisandram Law Firm; Raghunath S. Minisandram

(57) ABSTRACT

An electromagnetic voice coil actuator comprises a pot core magnet structure having a magnetic flux conductive core, a field coil within the pot core magnet structure for generating magnetic field through the magnetic flux conductive core and across an air gap, a voice coil disposed within the air gap. The voice coil and the field coil are each driven by an amplified signal derived from the audio input signal to create an actuation force, wherein the pot core magnet structure uses a soft magnet core.

22 Claims, 20 Drawing Sheets

SPEAKER WITH VOICE COIL AND FIELD COIL

CROSS-REFERENCE TO RELATED APPLICATIONS

This application is a continuation-in-part application of U.S. application Ser. No. 13/849,494 filed on Mar. 23, 2013, which claims priority from the U.S. provisional application Ser. No. 61/614,997, filed on Mar. 23, 2012. Application Ser. No. 13/849,494 filed on Mar. 23, 2013 is incorporated herein by reference in its entirety. Application No. 61/614,997 filed on Mar. 21 2012 is incorporated herein by reference in its entirety.

BACKGROUND OF THE DISCLOSURE

1. Technical Field of the Disclosure

The present invention is related in general to electromagnetic actuators, and in particular to a moving voice coil actuator or transducer which does not utilize costly permanent magnets.

2. Description of the Related Art

A typical speaker used today utilizes a transducer that transforms varying electrical signals to corresponding audible signals. A conventional loudspeaker typically has a stationary support frame or housing, a diaphragm which is the movable membrane, a permanent magnet mounted on the housing, a coil support connected longitudinally to the diaphragm and a voice coil wound transversally on the coil support within the magnetic field of the magnet. As is known by those skilled in the art, vibrations are induced in the voice coil and diaphragm when an alternating source signal is supplied to the voice coil by an amplifier or the like and the induced magnetic field interacts with the magnetic field of the permanent magnet to alternately attract and repel the voice coil.

Such speakers work well but the primary disadvantage with the use of such conventional speakers is they relatively large and heavy due to the presence of the permanent magnet. Conventional permanent magnet speakers thus lose their attractiveness in many applications such as automobiles, airplanes, or any other application in which maintaining a lightweight system is a concern. Conventional permanent magnet speakers also begin to lose their attractiveness in applications such as high-powered woofers in which the sheer size and weight of the permanent magnet required for the speaker increases the weight of the speaker beyond acceptable limits. Furthermore, typical permanent magnets suitable for voice coil actuators of speakers are fabricated from Neodymium Iron Boron (NdFeB), For a given magnetic field strength, a field coil constructed of copper wire will be of lower cost than the NdFeB magnet.

In the early days of speaker technology when permanent magnets were not stable and had the tendency to lose their magnetism, speakers were manufactured with a continuously powered stationary electromagnet. Such speakers include a frame, an electromagnet mounted on the frame, a movable membrane mounted on the frame, and a voice coil mounted on the membrane and movable therewith. The coil of electromagnet or field coil is continuously powered by an internal DC power source such as a battery to produce a constant-polarity magnetic field for interaction with the alternating field in voice coil. Speakers employing permanent electromagnets were not only heavy and cumbersome because they required their own internal power source, but were also very inefficient and were replaced by permanent magnet speakers as soon as permanent magnet technology was suitably developed. The electromagnets of such speakers, being powered by an independent power sources, also were necessarily not excited in proportion to the source signals exciting the voice coils.

Permanent magnets like Neodymium have more recently replaced the earlier used bulky and power consuming electromagnets. Due to this and other reasons, there has recently been a greater than one hundred fold increase in the price of rare earth Neodymium. Thus, the price of Rare earth NdFeB magnets has increased to a level that makes the use of NdFeB permanent magnets not viable for many applications. The costs have further spread to even the substantially lower performance ceramic permanent magnets, which have also increased in price, although not to the same extent as rare earth NdFeB permanent magnets. Because of the current costs associated with them, it must be asked when it remains appropriate to use NdFeB in bulk form such as the way Neodymium is currently used in NdFeB magnets. It is not inconceivable that the use of rare earth elements such as Neodymium will be restricted to those applications where they are used in 2-D film and nano or micro-sheet formats as opposed to 3-D bulk applications such as the weighty and wasteful permanent magnets employed in today's loudspeakers and other motors.

Voice coil actuators are electromagnetic devices that provide force proportional to current applied to a coil. A typical voice coil actuator comprises a coil assembly and a magnet assembly. The magnet assembly comprises inner and outer yokes of soft magnet material, which each conduct magnetic flux and which together define an air gap in which the coil assembly is suspended for movement within the air gap. The magneto motive force, $F_m$, which drives this magnetic flux, can either be created by a permanent magnet or a field coil with electric current carrying wire encircling a soft magnetic material core.

In a typical voice coil actuator, an electrical current conductive coil is suspended at a zero current bias position within a magnetic field formed in a gap. The flux path of the field within this gap may be optimally radial with respect to the axis of the coil so that when an externally applied current conducts through the coil, a Lorentz force will be developed which displaces the coil axially from its zero current bias position. As is known, the Lorentz force is linearly proportional to the coil current. Different configurations of voice coil actuators can provide different shapes of Force vs. Stroke curves. In the known prior art related to the voice coil actuator, the magnetic field in the gap is derived from a permanent magnet core.

The most common magnet system topologies for permanent magnet voice coil actuators are radially symmetric or axisymmetric. The system topologies typical of microspeakers include center magnet topology, ring-magnet topology, and double-magnet topology. These topologies are generally fully scalable to all common sizes of loudspeakers. The pot core magnet structure (center magnet topology) has the inherent advantage of lowest stray-field losses compared to the other topologies. In addition to the radially symmetric voice coil actuators described above, there are two additional electromagnetic voice coil actuator topologies commonly employed in loudspeakers namely, planar voice coil actuators arid radial magnet voice coil actuators.

Magnet-less speakers without permanent magnets and that employ two electromagnetic coils, one of which is mounted on a movable membrane and the other of which is mounted on a fixed frame, are known in the art and were in fact in wide use prior to the advent of reliable permanent magnets. Recent advancements in the art provide a lightweight speaker constructed without permanent magnets by providing two coils, one of which is mounted on a movable membrane and the other of which is mounted on a fixed frame. The coils are mounted in close proximity to one another and excited by a common source signal from a common amplifier or the like in such a fashion that the electromagnetic fields created by the coils upon excitation interact to cause the coils to alternately attract and repel one another. One of the coils is fed with an excitation signal directly from the source. The other coil receives the source signal only indirectly, preferably via a bridge rectifier. The coils may take the form of conventional wound wires or, in a particularly sophisticated yet inexpensive embodiment, may be formed on a printed circuit board in the form of flat spirals. The resulting speaker is very lightweight and thus is well suited for use in automobiles, airplanes, and other applications in which weight minimization is important. However, the source signal is not split using digital signal processing for the purpose of feeding the two coils. Hence, there is no provision for providing a feedback signal to linearize the actuation three so that it is a faithful representation of the incoming audio signal.

One of the existing field coil actuators includes a magnetic flux conductive material case, an electrical current conductive field coil and two electrical current conductive moving coils uniquely arranged. The case has a first surface and a continuous channel disposed in said first surface. The channel has a pair of opposing walls. The field coil is disposed within the channel between the walls so that a gap remains between the walls above the field coil and another gap remains between the walls below the field coil. When a current is induced in the field coil, magnetic flux is developed across the gaps. The flux is confined substantially normal to the walls of the channel. The electrical current conductive moving coils are each disposed moveably in one of the gaps such that an electrical current in the coil develops a Lorentz force on each of the coils in a direction substantially normal to the current in the moving coil and the magnetic flux to displace the moving coil in response to the current in the moving coil. However, an independent power source is require to produce the constant magnetic flux and thus a DC current must to be applied to the field coil in order for the system to be operational.

Yet another conventional voice coil actuator includes a magnetic flux conductive material core a magnet and an electrical current conductive coil. The core has a first surface and a continuous channel disposed in said first surface. The channel has a pair of opposing walls. The magnet is disposed in intimate contact with a first one of said walls and spaced from a second one of said walls so that a gap remains between the magnet and the second one of the walls. The magnet has a first face of a first magnetic polarity facing the first one of the walls and a second face of a second, opposite magnetic polarity facing the gap. The magnet is further spaced from a bottom of the channel so that magnetic flux is substantially normal from the second face across said gap to the second one of the walls. The electrical current conductive coil is disposed moveably in the gap such that an electrical current in the coil develops a magnetic force on the coil in a direction substantially normal to the magnetic flux to displace said coil in response to said magnetic force. However, a major difficulty with conventional single-ended planar magnet loudspeaker designs, as in this case, is the presence of low-frequency range distortion.

Various other loudspeakers exist that include a magnetic circuit having a magnet, a lower plate, and an upper plate. In the magnetic circuit, a gap between magnetic poles is formed between the upper plate and a center pole that stands straight from a center position of the lower plate. A voice coil is located within the gap. A center cap is mounted in the vicinity of an upper end of the coil bobbin, The speaker further comprises a diaphragm, an edge to be connected with an outer periphery of the diaphragm, and a bent portion thrilled in the vicinity of a border of as connecting portion connecting the diaphragm and the edge, wherein it is possible to prevent strength deterioration or damage of the diaphragm even when sound signals having large amplitude is inputted, and to prevent deterioration of acoustic characteristics. The bent portion is provided with a reinforcing portion in order to reinforce the bent portion. However, such loudspeakers employ permanent magnets in their voice coil actuators.

Based on the foregoing there is a demonstrable need for a voice coil actuator device that eliminates the use of permanent magnets and uses a low cost iron electromagnet structure. Such a needed voice coil actuator would comprise an integrated amplifier and field coil driver. The voice coil actuator device when integrated with loudspeaker drivers would operate as electrically efficient as class-D amplifiers, when driving contemporary loudspeaker drivers. The actuator would provide an efficient magnet circuit with log magnet flux loss from stray fields using pot core magnet structure geometry for the voice coil actuator's electromagnet. The device would use Soft Magnetic Composites (SMC) material for the pot core magnet structure that has Ferromagnetic or Super paramagnetic behavior with a near linear response to the input audio or other actuating signal, low eddy current losses in the electromagnet structure and AC operation from DC to 20 KHz. The needed device would include electronics signal processing that provides a linear response of the actuation force in both amplitude and frequency to the incoming audio signal and that has a bandwidth from DC to 20 KHz. The needed electronics signal processing units would employ negative feedback to linearize the actuation force so that it would be a faithful representation of the incoming audio signal. In addition, the needed device would employ efficient electronics amplification of audio signals using pulse width modulated (PWM) Class-D amplifiers for driving both the voice coil and field coil. Further, the device would offer significant weight reduction and efficient recirculation of the magnetic energy generated by the field coil and stored in the voice coil air gap. The needed device would also be able to integrate the magnet-less voice coil actuator with the electronic integrated circuits to provide a loudspeaker drive motor which can receive low level analog or digital noise free audio signals and power. Further, the needed device would extend the magnet-less methodology to other voice coil actuator topologies with linear motion and permanent magnet motors with rotational motion. Finally, the voice coil actuator would provide as method of encrypting copyrighted and other high-resolution audio works of art. The present invention overcomes prior art shortcomings by accomplishing these critical objectives.

SUMMARY OF THE DISCLOSURE

In one embodiment, an electromagnetic voice coil actuator is disclosed. The voice coil actuator includes a of core magnet structure having a magnetic flux conductive core. A field coil is disposed within the pot core magnet structure for generating magnetic flux lines through the magnetic flux conductive core and across an air gap. A voice coil is disposed within the air gap. The voice coil and the field coil are each driven by an amplified signal derived from an audio input signal to create an actuation force, wherein the pot core magnet structure uses a soft magnetic core.

In another embodiment, an electromagnetic voice coil actuator is disclosed. An electronic signal processor is configured to split an audio input signal into a first signal and a second signal. A field coil actuated by the first signal generating a magnetic field across an air gap and a voice coil disposed within the air gap, the voice coil being actuated by the second signal.

This brief summary is provided so that the nature of the disclosure may he understood quickly. A more complete understanding of the disclosure can be obtained by reference to the following detailed description of the preferred embodiments thereof in connection with the attached drawings.

BRIEF DESCRIPTION OF THE DRAWINGS

In order to enhance their clarity and improve understanding of these various elements and embodiments of the invention elements in the figures have not necessarily been drawn to scale. Furthermore, elements that are known to be common and well understood to those in the industry are not depicted in order to provide a clear view of the various embodiments of the invention, thus the drawings are generalized in form in the interest of clarity and conciseness.

FIG. 2B is a graph of a simulation of air gap magnetic flux density vs. $B_g$/Tesla of the permanent magnet voice coil actuator having center magnet topology shown in FIG. 2A:

Figure 4A:
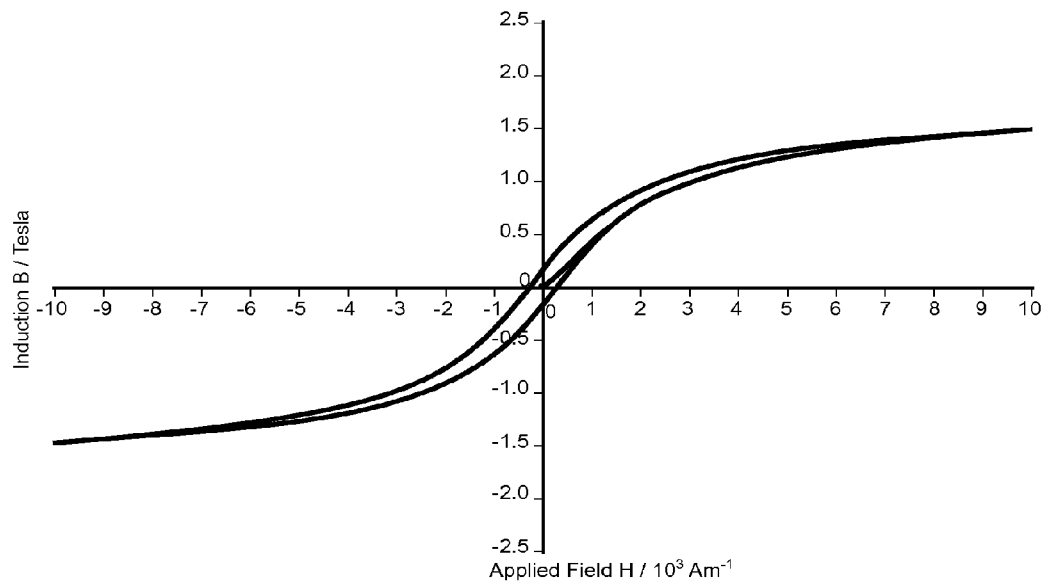
Figure 4B:
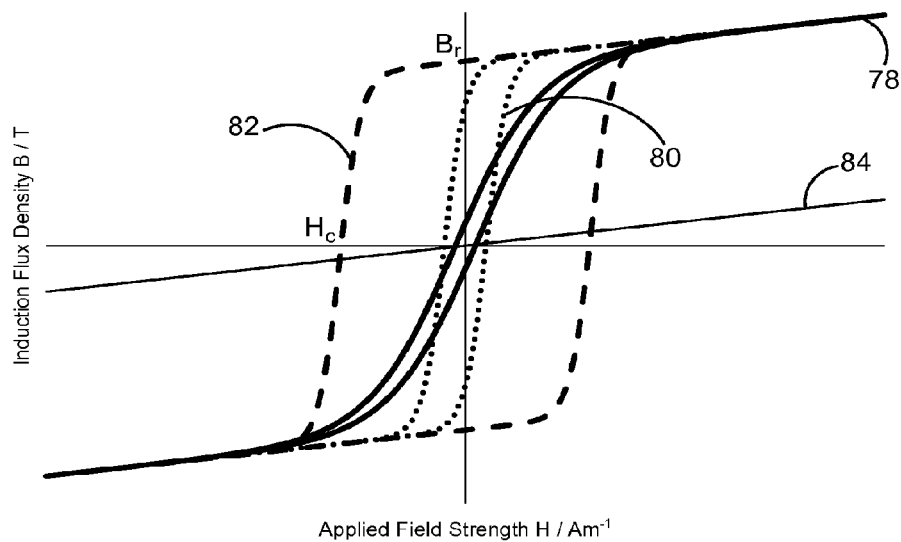
Figure 4C:
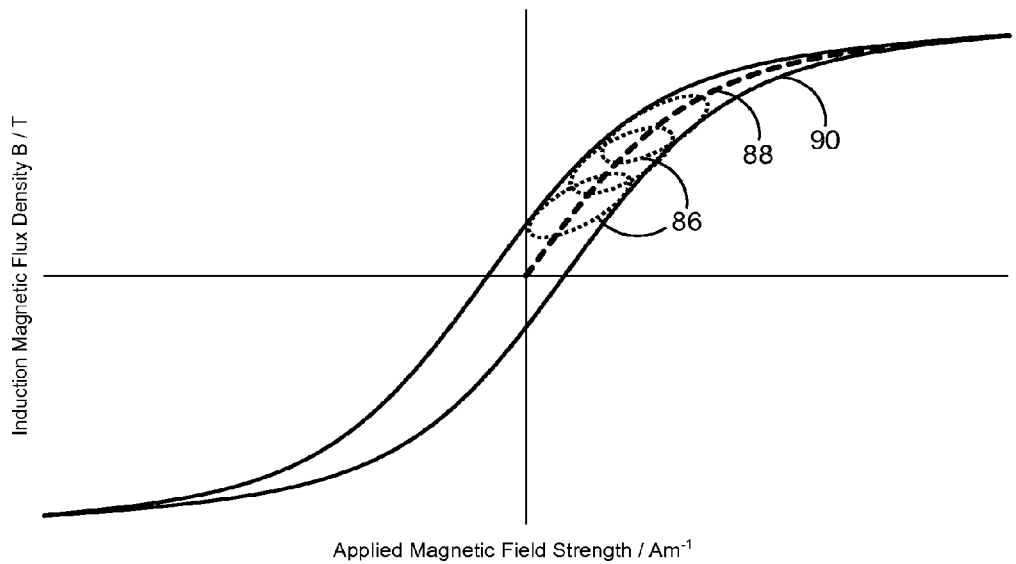
Figure 5:
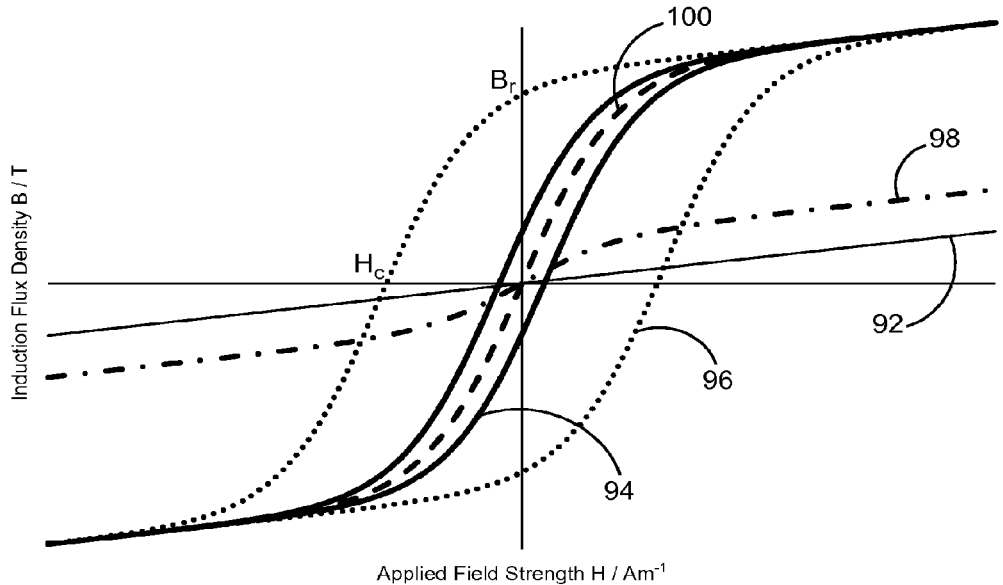
Figure 6A:
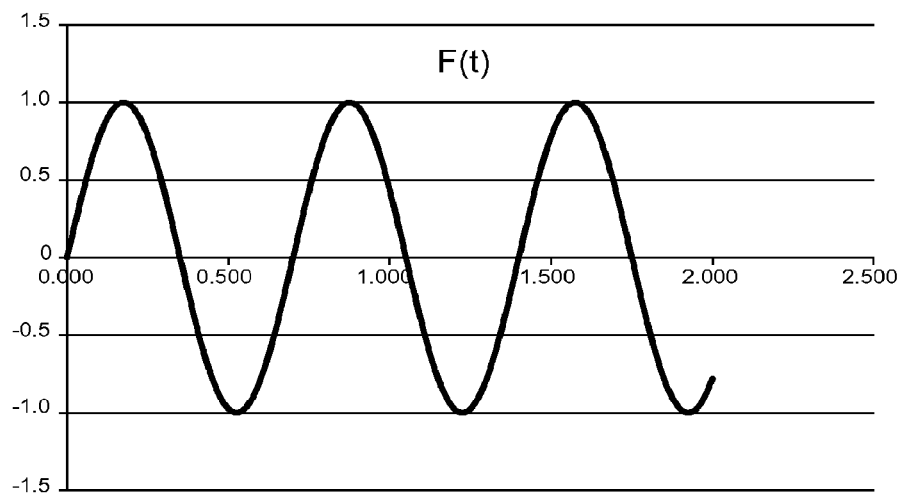
Figure 6B:
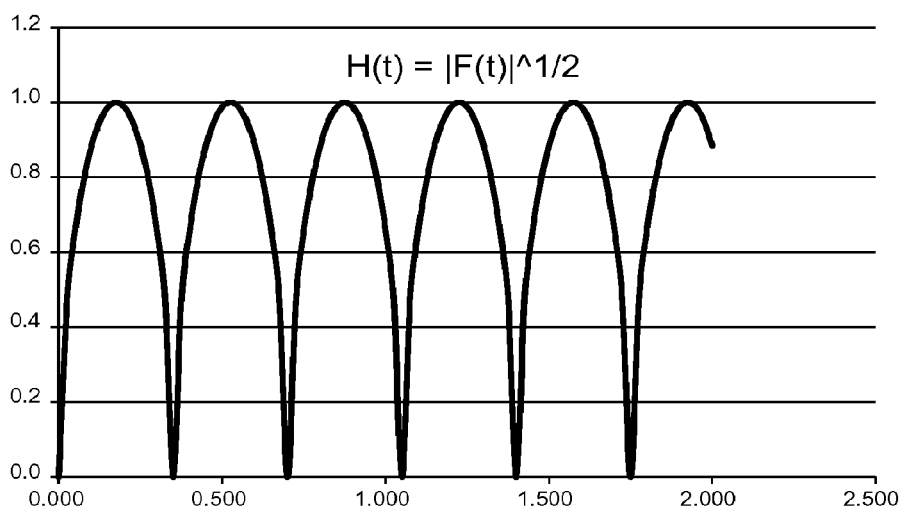
Figure 6C:
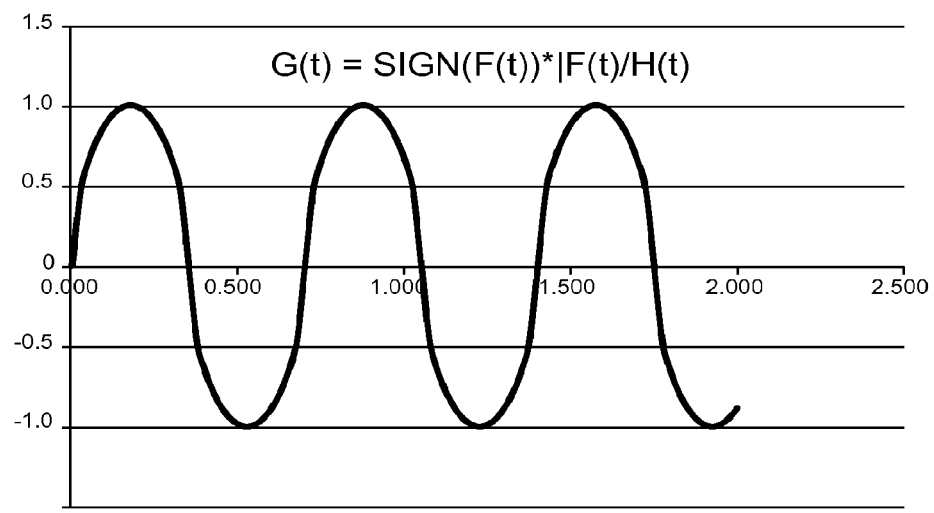
Figure 6D:
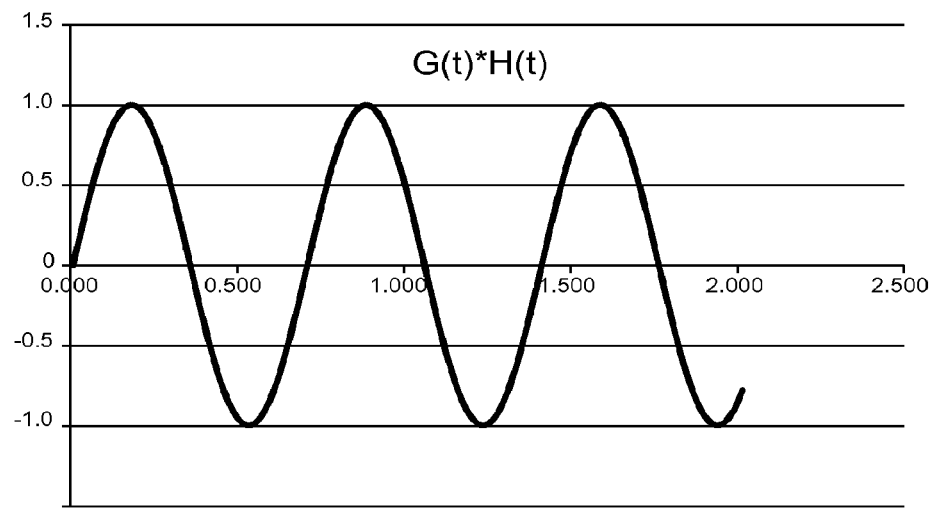
Figure 6E:
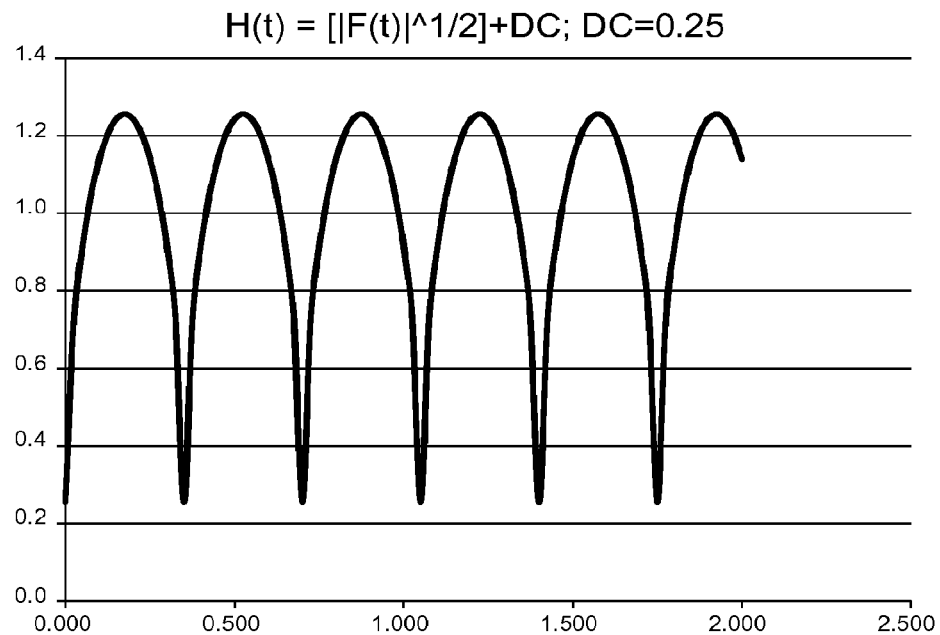
Figure 6F:
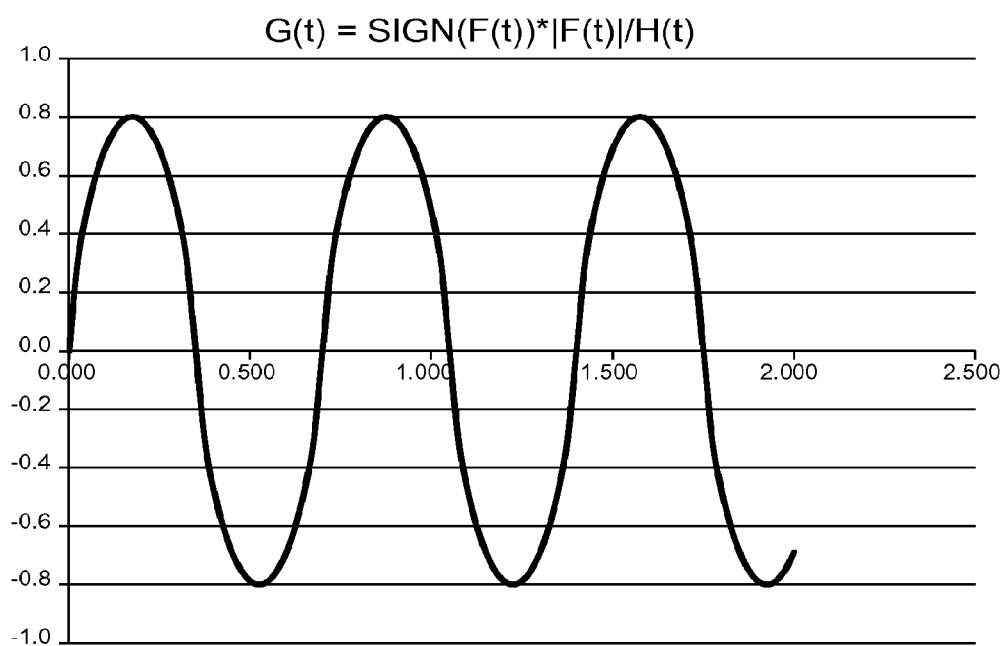
Figure 6G:
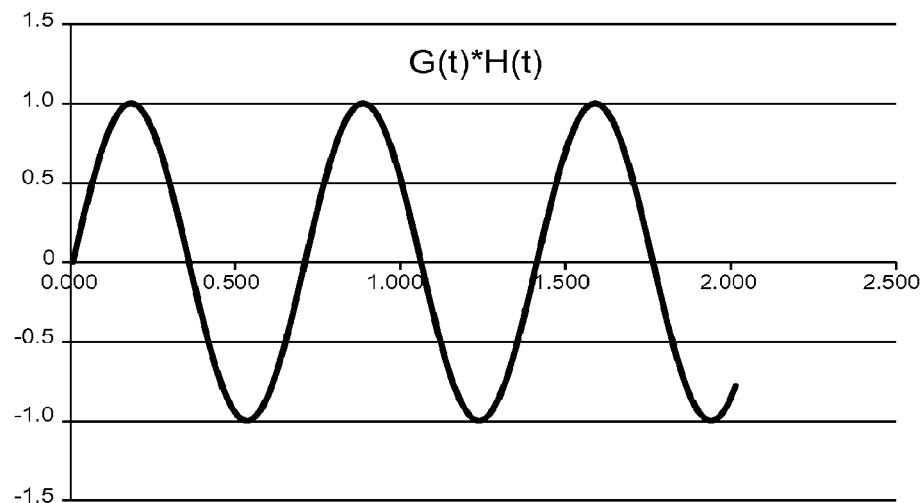
Figure 6H:
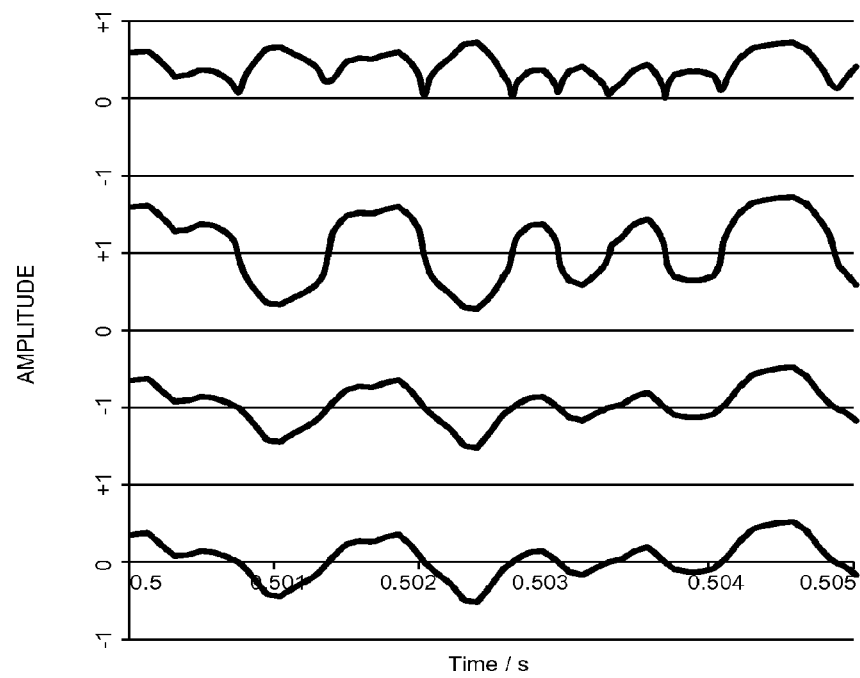
Figure 6I:
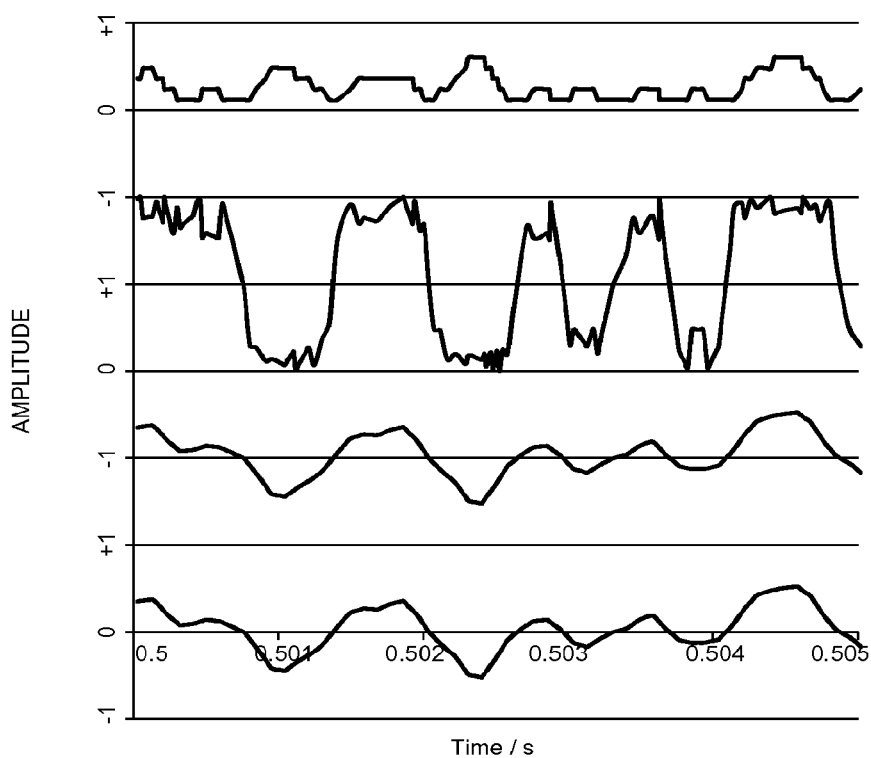
Figure 7:
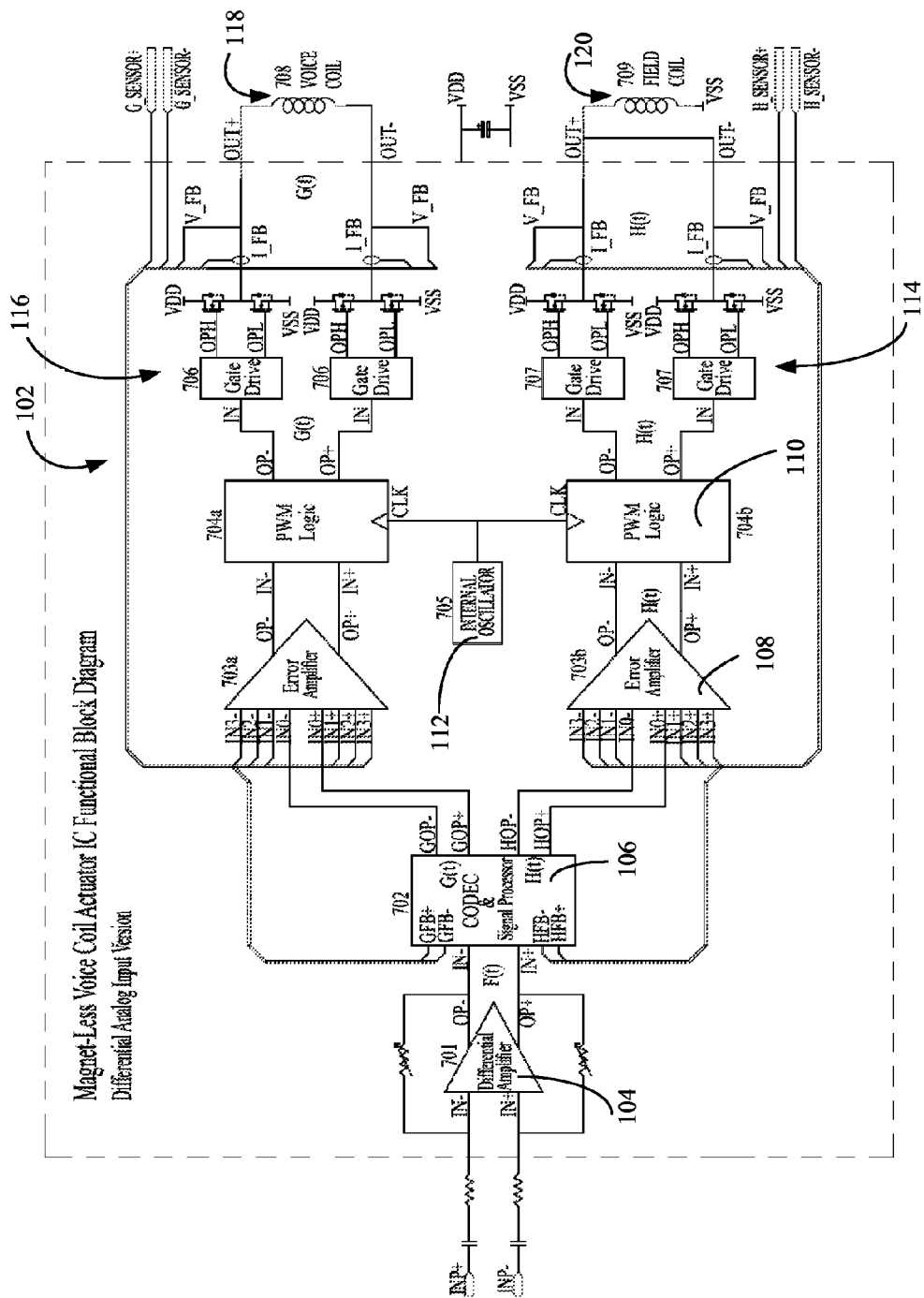
Figure 8A:
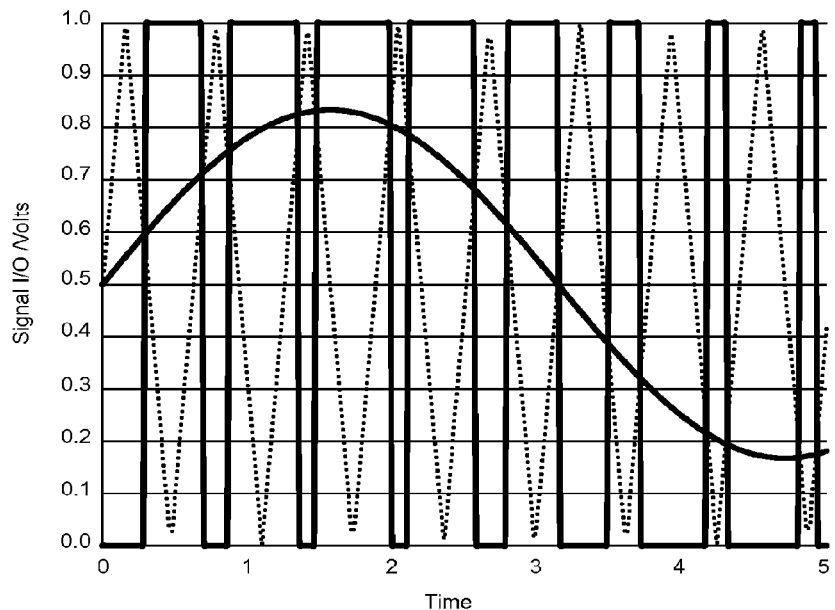
Figure 8B:
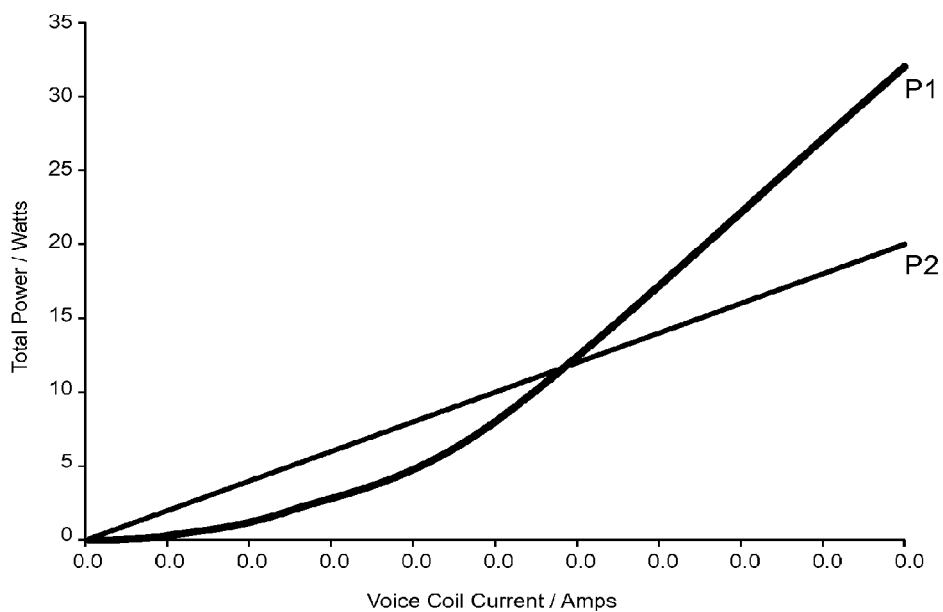
Figure 8C:
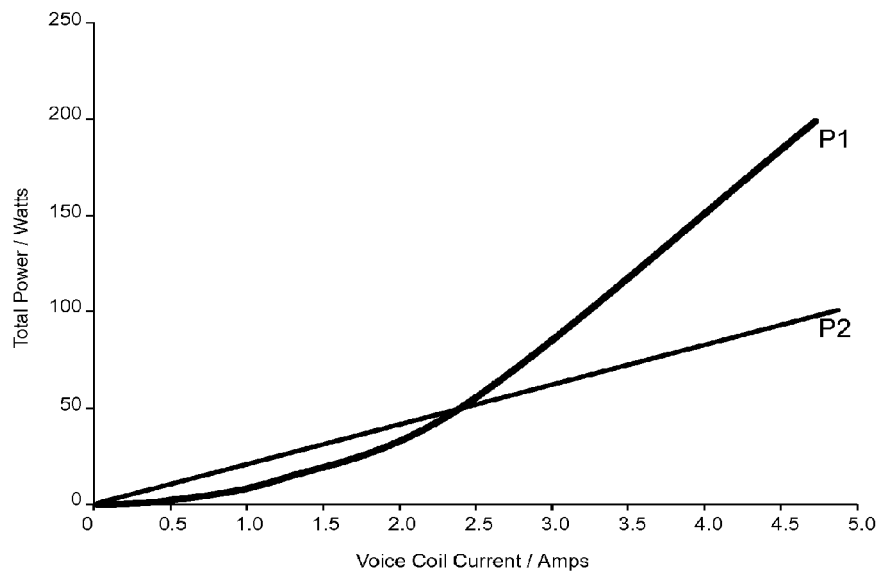
Figure 9A:
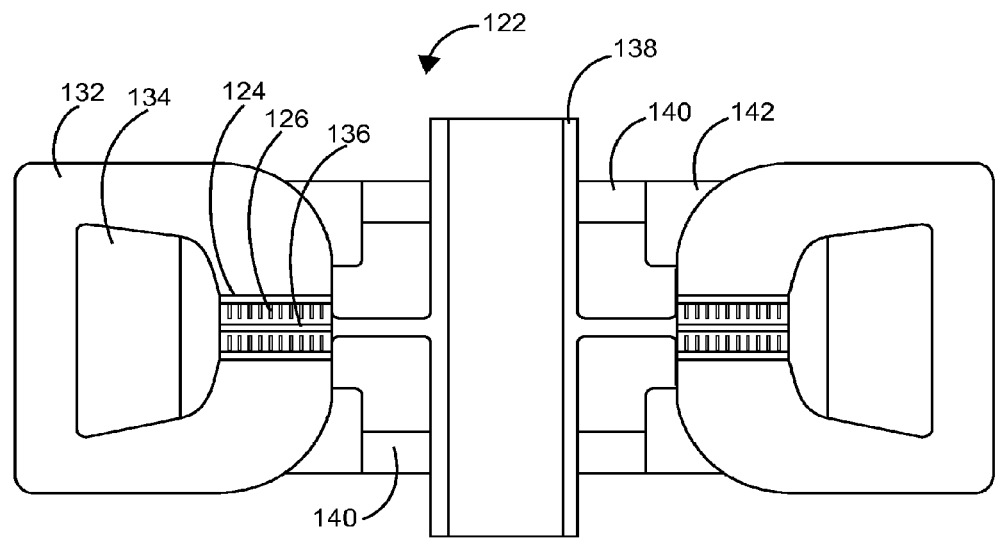
Figure 9B:
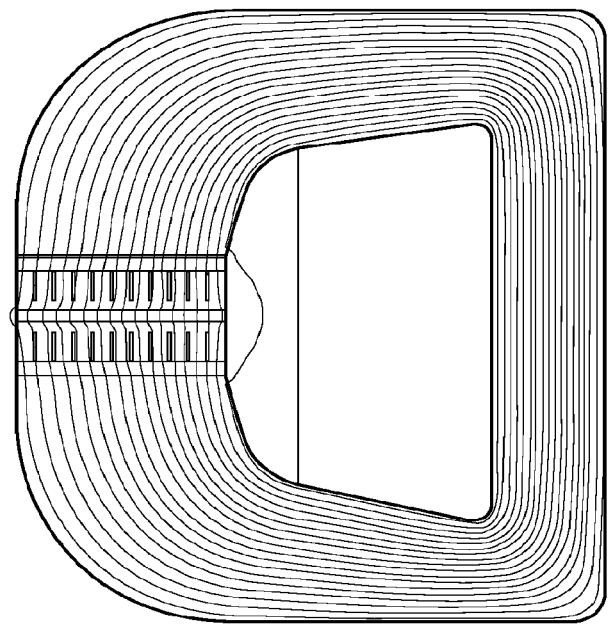
Figure 9C:
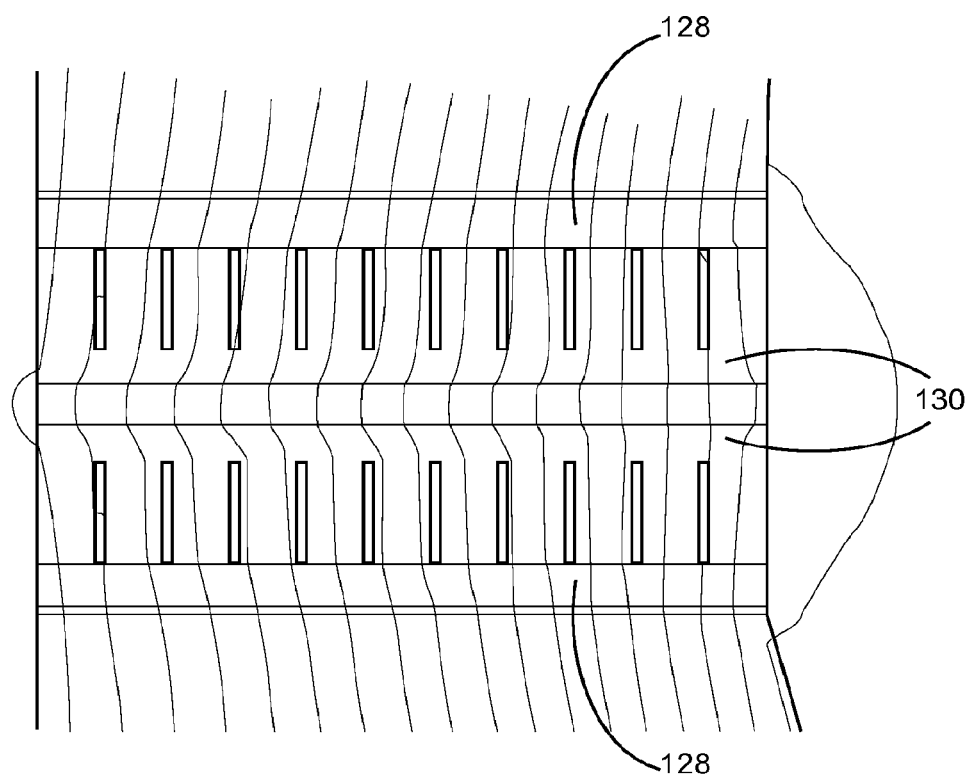
Figure 9D:
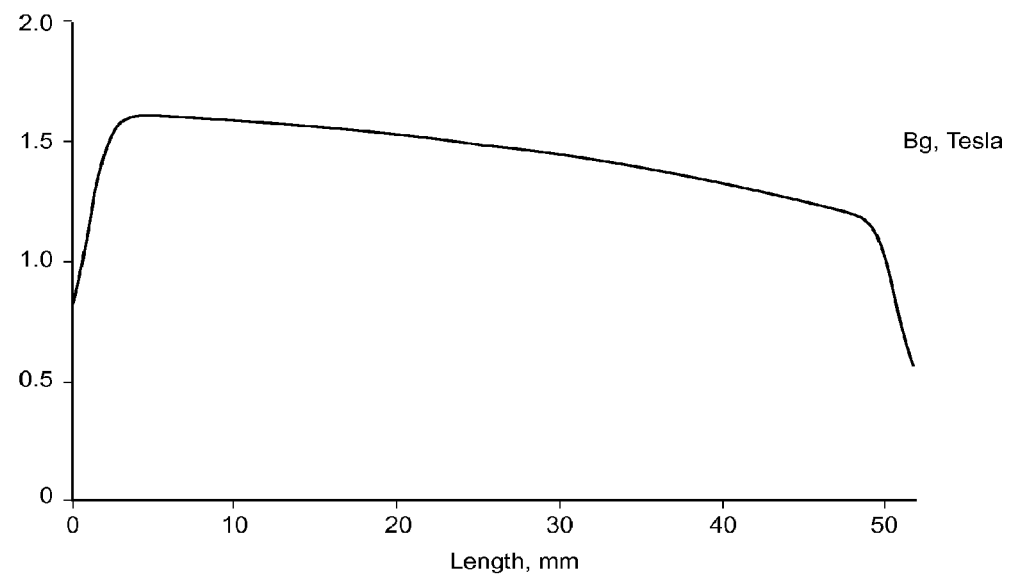
Figure 10A:
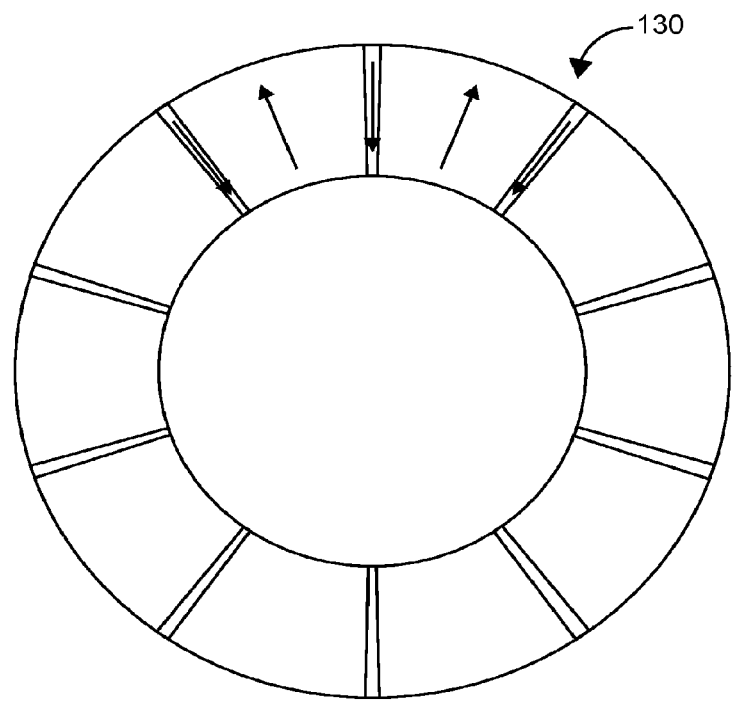
Figure 10B:
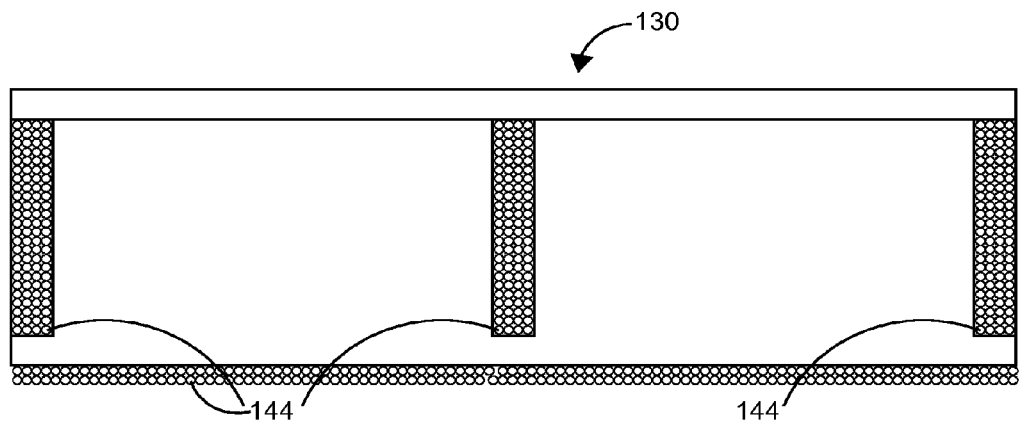
Figure 11A:
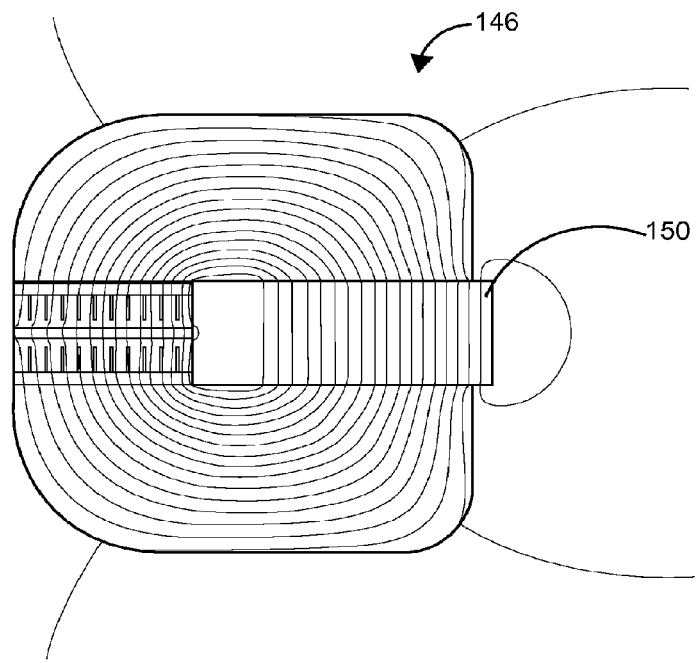
Figure 11B:
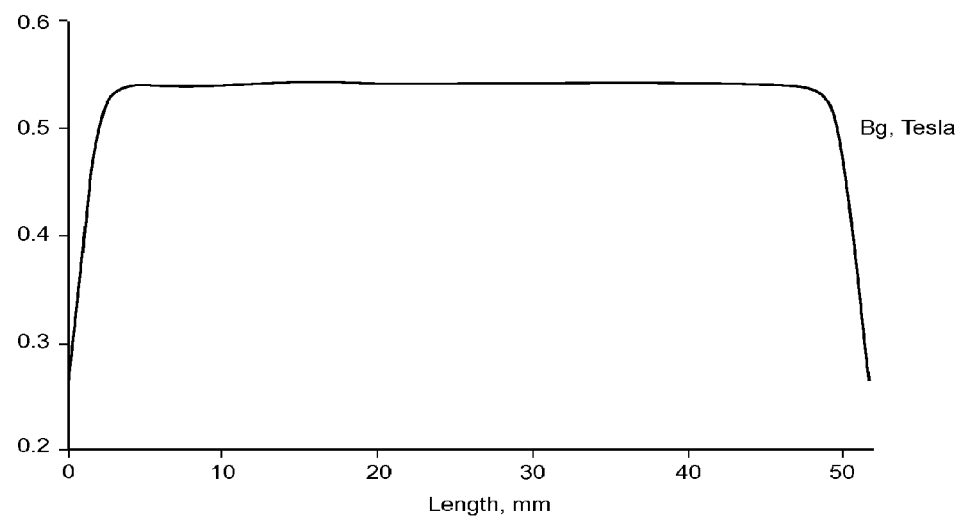
Figure 11C:
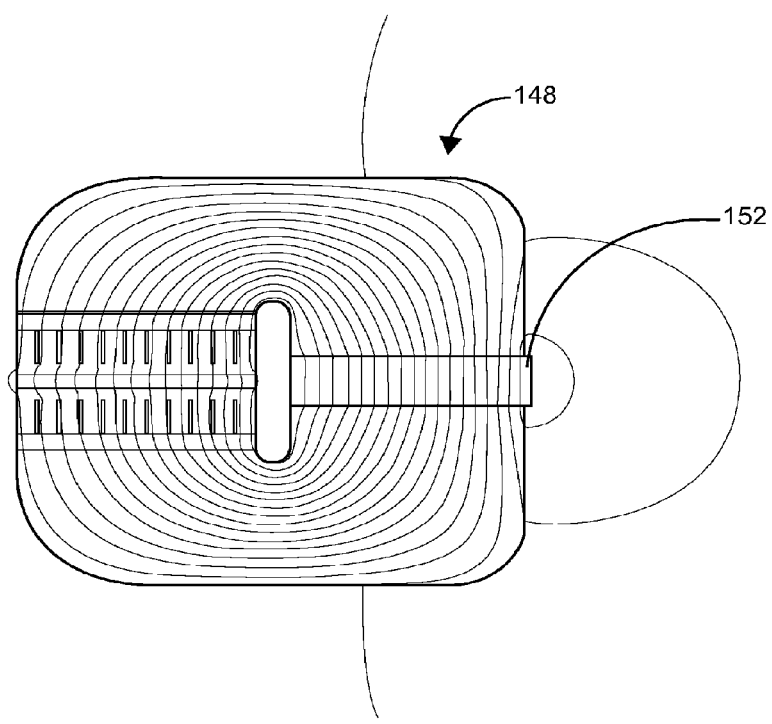
Figure 11D:
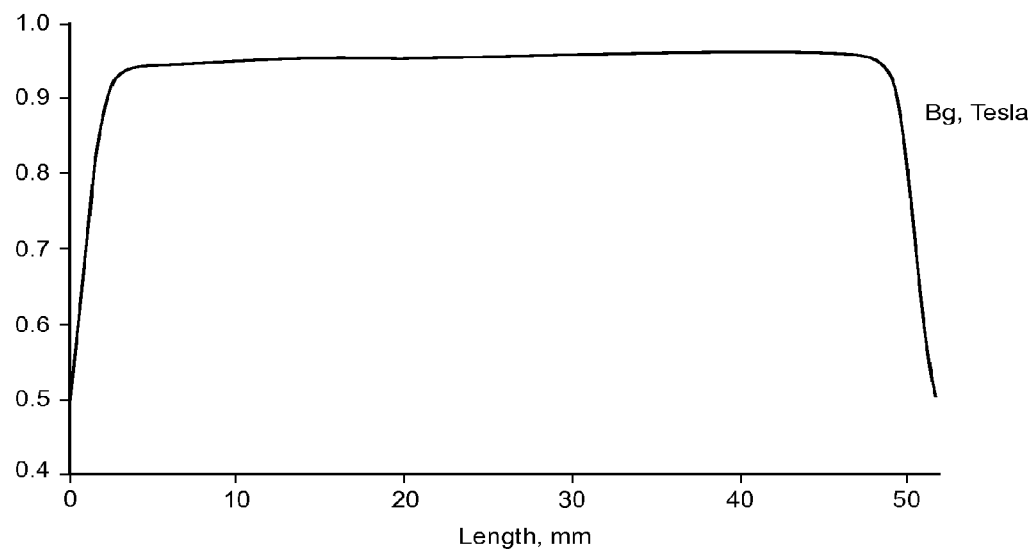

FIG, 4A is a graph of the hysteresis B-H curve for soft magnet composite (SMC) material ArcoLam 2FHR;

FIG. 4B is a graph of the hysteresis B-H loops typical of hard and soft ferromagnetic materials;

FIG. 4C is a graph of the hysteresis B-H curve for minor loops for ArcoLam 2FHR;

FIG. 5 is a graph of the B-H curves showing hysteresis phenomena of ferromagnetism (steel & SMC), paramagnetism, and superparamagnetism;

FIG. 6A is a graph showing signal processing F(t) for an incoming bipolar audio signal;

FIG. 6B is a graph showing signal processing H(t) for a positive definite field coil signal;

FIG. 6C is a graph showing signal processing G(t) for a bipolar voice coil signal;

FIG. 6D is a graph showing signal processing H(t)*G(t) for as reconstructed bipolar actuation force signal;

FIG. 6E is a graph showing signal processing H(t) for a positive definite field coil signal with DC offset 0.25 added;

FIG. 6F is a graph showing signal processing G(t) for a bipolar voice coil signal processed from the DC offset signal;

FIG. 6G is a graph showing signal processing H(t)*G(t) for a reconstructed bipolar actuation force signal processed from the DC offset signal;

FIG. 6H is a graph showing the square root signal processing as in FIGS. 6A-6G with real audio speech signal;

FIG. 6I is a graph showing the square are root signal processing as in FIGS. 6A-6G with real audio speech signal processed with a step function;

FIG. 7 is a functional block diagram and general circuit description of a normal open loop amplifier drive system with voltage feedback for a magnet-less voice coil actuator class-d amplifier;

FIG. 8A is a graph showing a typical Pulse Width Modulation Scheme for a Single Ended Class-D amplifier;

FIG. 8B a graph showing total power P2 for magnet-less voice coil actuator and P1 for conventional voice coil actuator as a function of conventional voice coil current $I_{vc}$ for small loudspeakers;

FIG. 8C is as graph showing power P2 for magnet-less voice actuator and P1 for conventional voice coil actuator as a function of conventional voice coil current $I_{vc}$ for large loudspeakers;

FIG. 9A is a cross-sectional view of an axisymmetric schematic depiction of a PCMS (Pot Core Magnet Structure) rotational motor;

FIG. 9B is a simulation of flux lines of the PCMS rotational motor shown in FIG. 9A;

FIG. 9C is a simulation of flux lines of the rotor section of the PCMS rotational motor shown in FIG. 9A;

FIG. 9D is a graph showing the magnetic flux density in the rotor coil gap ($B_g$/Tesla) vs. length in mm from points A to B as shown in FIG. 9C;

FIG. 10A is a plan view of a PCMS motor rotor coil former;

FIG. 10B is a top view of a top rotor coil former with close pack winding showing return wiring path;

FIG. 11A is as half axial view of a simulation of flux lines of a brushless pot core motor using ceramic permanent ring magnet;

FIG. 11B is a graph of a simulation of air gap magnetic flux density of the brushless pot core motor using ceramic permanent ring magnet in FIG. 11A;

FIG. 11C is as half axial view of a simulation of flux lines of a brushless pot core motor using rare earth NdFeB permanent ring magnet; and FIG. 11D is a graph of a simulation of air gap magnetic flux density of the brushless pot core motor using rare earth NdFeB permanent ring magnet in FIG. 11C.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each he used independently of one another or in combination with other features. However, any single inventive feature may not address any of the problems discussed above or only address one of the problems discussed above. Further, one or more of the problems discussed above may not be fully addressed by any of the features described below.

Figure 1A:
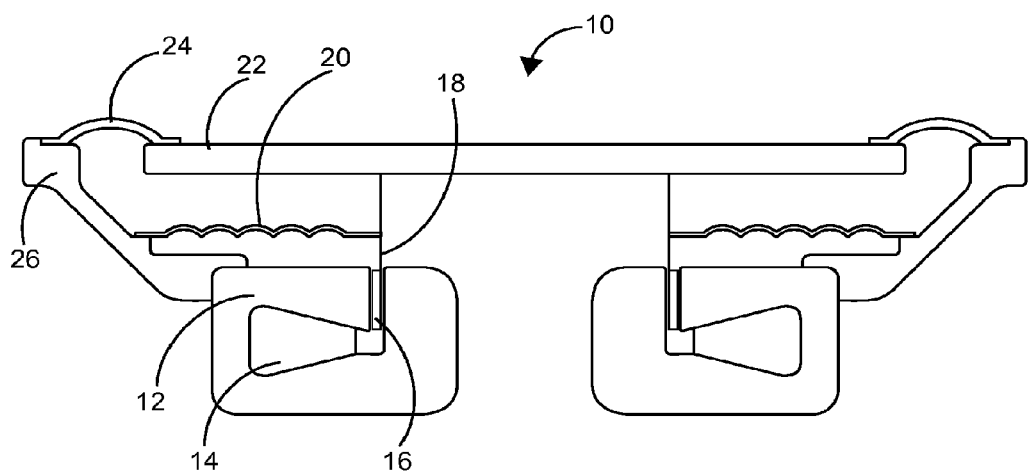
FIG. 1A is a cross-sectional view of a schematic depiction of a preferred embodiment of a magnet-less voice coil actuator incorporated into a full range flat panel loudspeaker driver.

FIG. 1A is a cross-sectional view of a schematic depiction of a preferred embodiment of as magnet-less electromagnetic voice coil actuator 10 incorporated into a full range flat panel loudspeaker driver. The magnet-less electromagnetic voice coil actuator 10 comprises a pot core magnet structure 12 having a soft magnetic flux conductive core preferably press molded from an insulated powder metal ArcoLam 2FHR soft magnetic composite (SMC), within which a field coil 14 having as high number of turns creates magnetic flux through the pot core magnet structure 12 and across an air gap within which a voice coil 16 is under-hung and wound onto a voice coil former 18. The pot core magnet structure 12 and the field coil 14 have an out-board magnetic design. The voice coil former 18 typically has a diameter of 32 mm and is fabricated using 75-100 µm thickness Kapton®, a polyimide film developed by E.I. du Pont de Nemours and Company based out of Wilmington, Del. Typically the voice coil 16 is fabricated using copper clad aluminum with a resistance of 8 Ω. The voice coil former 18 is suspended at its lower end by a resin impregnated cloth spider 20 of high compliance suspension and its upper end is attached to a central part of an 85 mm diameter light stiff composite flat panel 22, typically of sandwich construction with high shear core. The light stiff composite flat panel 22 is suspended at its edge by as rubber roil surround suspension 24. The rubber roll-surround suspension 24 comprising the resin impregnated cloth spider 20 and the rubber roil-surround suspension 24 substantially restricts motion of the light stiff composite flat panel 22 in the x-y plane but allows free motion, with a well-defined compliance, along the z-axis. A ventilated support basket 26, typically fabricated in molded plastic, or die cast aluminum, provides the mechanical structure to the loudspeaker for mounting in a baffle or enclosure. A large through hole in the center of the pot core magnet structure 12 makes assembly of the light stiff composite flat panel 22 easier than with prior art loudspeaker motors where access to centering of the voice coil former during assembly is otherwise difficult.

Figure 1B:
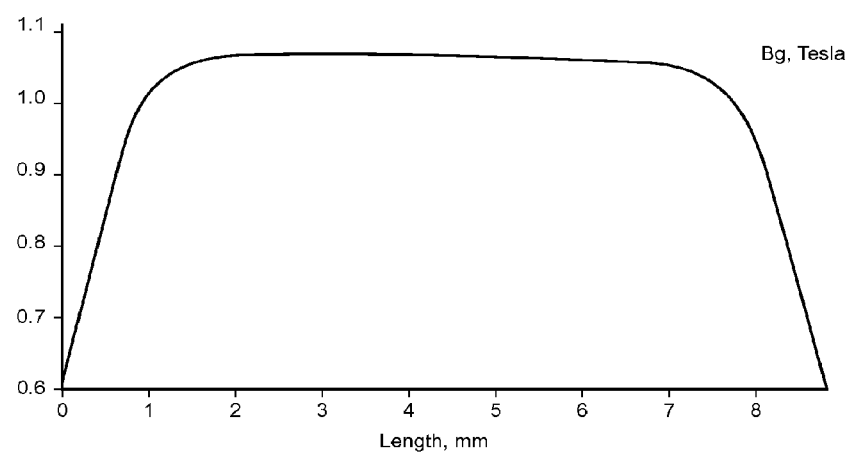
FIG. 1B is a graph of a simulation of air gap magnetic flux density $B_g$/Tesla of the magnet-less voice coil actuator

Turning to FIG. 1B, a graph of a simulation of air gap magnetic flux density $B_g$/Tesla of the magnet-less electromagnet voice coil 10 is shown. A peak field cod current $I_{fc}$ of 3 Amps is used to energize the field coil 14. The magnetic flux density $B_g$ in the air gap normal to the line defined by a pair of fiduciary reference points 28 and 30 (Refer FIG. 1C) is plotted as a function of distance in mm from the point 30 to 28. The desirable flattened curve with magnetic flux density of 1.0 to 1.1 T allows as highly linear maximum displacement ($x_{max}$) of over 6 mm for an under-hung voice-coil 16, which is very difficult to achieve within similar sized prior art voice coil actuators.

Figure 1C:
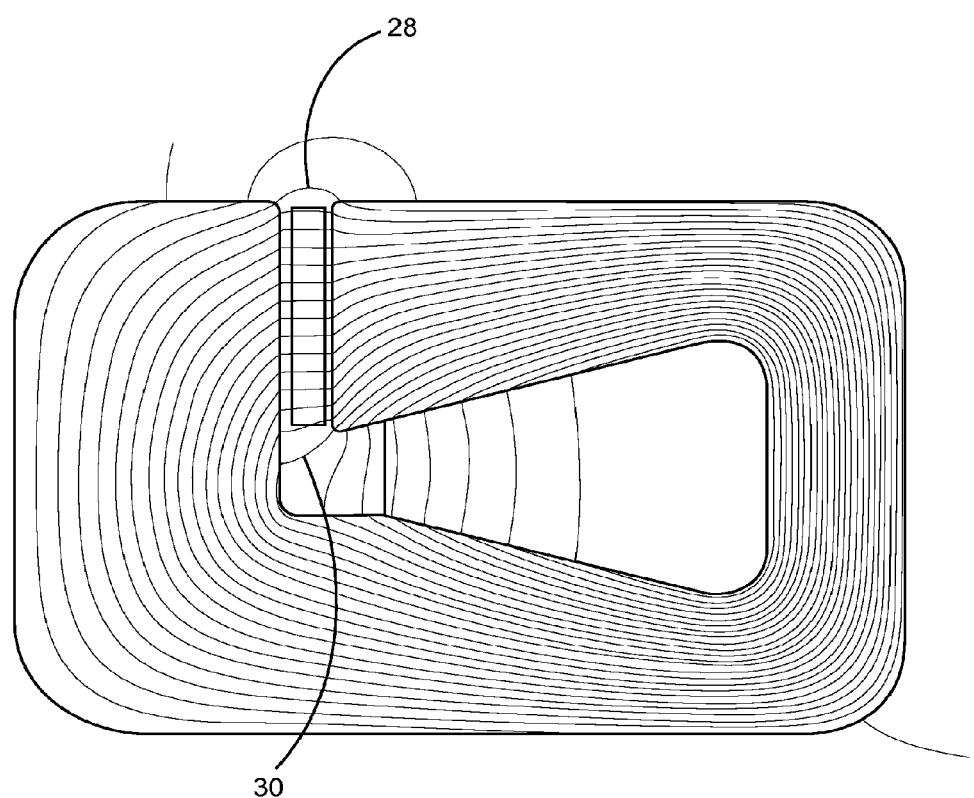
FIG. 1C is a simulation of flux lines of the magnet-less voice coil actuator.

Turning to FIG. 1C, a simulation of flux lines of the magnet-less electromagnetic voice coil actuator 10 shown in FIG. 1A is shown. The simulation provides results for a 32 mm diameter voice coil 16 with a DC resistance of 8 Ω, an estimated peak motor force factor $BL_{pk}$=15.5 Tm (at $I_{fc}$=3A) and $x_{max}$=6 mm. The points 28 and 30 are the fiduciary reference points.

Figure 2A:
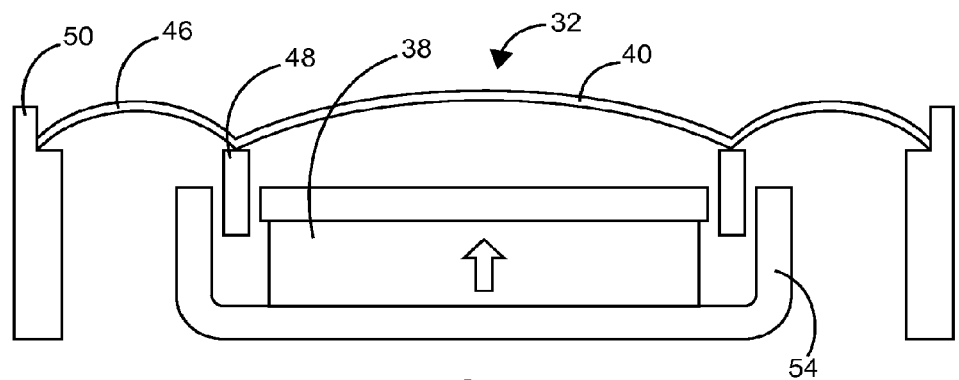
FIG. 2A is a cross-sectional view of a permanent magnet voice coil actuator having a center magnet topology.
Figure 2B:
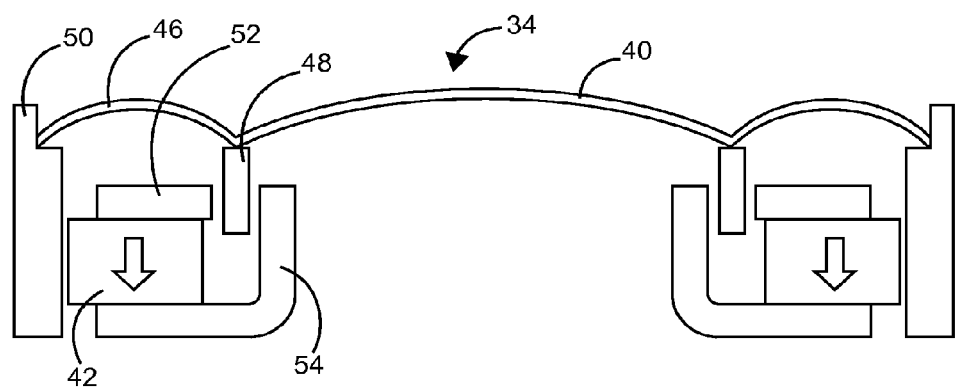
FIG. 2B is a cross-sectional view of a permanent magnet voice coil actuator having, a ring-magnet topology.
Figure 2C:
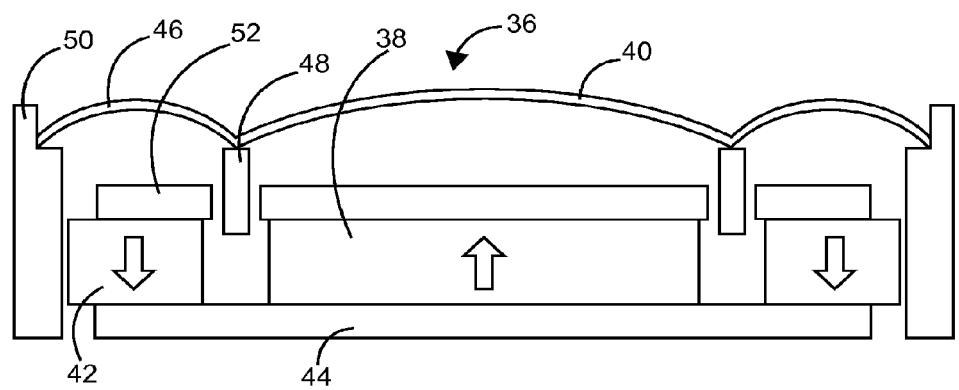
FIG. 2C is a cross-sectional view of a permanent magnet voice coil actuator having a double-magnet topology.

The most common magnet system topologies for permanent magnet voice coil actuators include center magnet topology, ring-magnet topology, and double-magnet topology. These are radially symmetric. FIGS. 2A-2C depict cross sections of typical micro-speaker topologies. FIG. 2A is a cross-sectional view of a permanent magnet voice coil actuator having a center magnet topology 32. FIG. 2B is as cross-sectional view of as permanent magnet voice coil actuator having a ring-magnet topology 34. FIG. 2C is a cross-sectional view of a permanent magnet voice coil actuator having a double-magnet topology 36. The center-magnet topology is characterized by the magnet 38 and top panel or dome 40 being inside of a pot core magnet structure geometry that closes the magnet path on the outside. A magnet ring 42 with an outer top panel or dome 40 and a yoke geometry, closing the magnet path on the inside, characterizes the ring-magnet topology. The double-magnet topology is characterized by inner magnet 38 and outer magnets 42 and top panel or dome 40 together with a back plate 44. The micro-speaker dome diaphragm 40 and the outer half-torus ring suspension 46 are formed as one piece and bonded to a self-supported voice coil 48 fabricated from bonded magnet wire. The outer edge of the ring suspension is attached to the support basket 50, so that the voice coil 48 is suspended within the air-gap formed by the top pole pieces 52 and the bottom pole piece 54. The pole pieces are made from low carbon steel or other soft magnet material. The center neodymium (NdFeB) disk magnets 38 and outer NdFeB ring magnets 42 drive the magnetic flux through the magnet system.

Figure 2D:
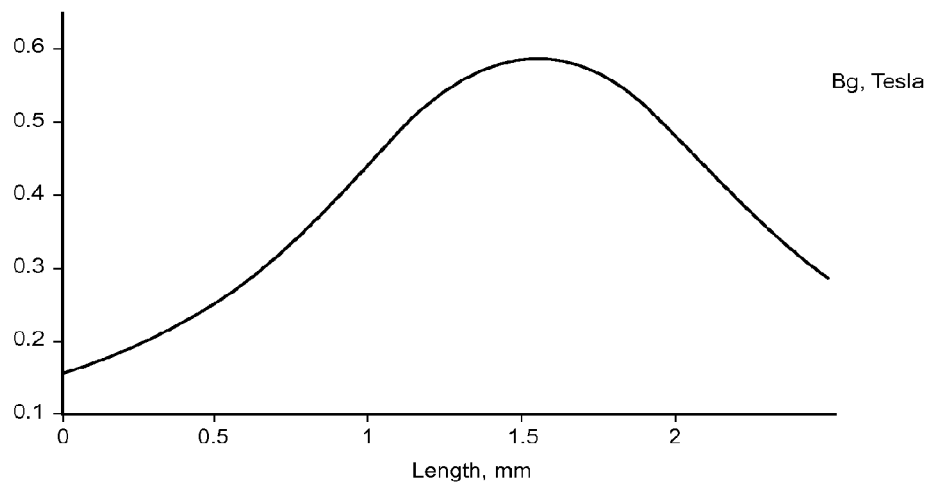
FIG. 2E is a graph of a simulation of air gap magnetic flux density vs. $B_g$/Tesla of the permanent magnet voice coil actuator having double-magnet topology shown in FIG. 2C.

As discussed above, FIG. 2D is a graph of a simulation of air gap magnetic flux density vs. $B_g$/Tesla of the permanent magnet voice coil actuator having center magnet topology 32 shown in FIG. 2A. In the case, the micro-speaker has as 10 mm voice coil diameter.

Figure 2E:
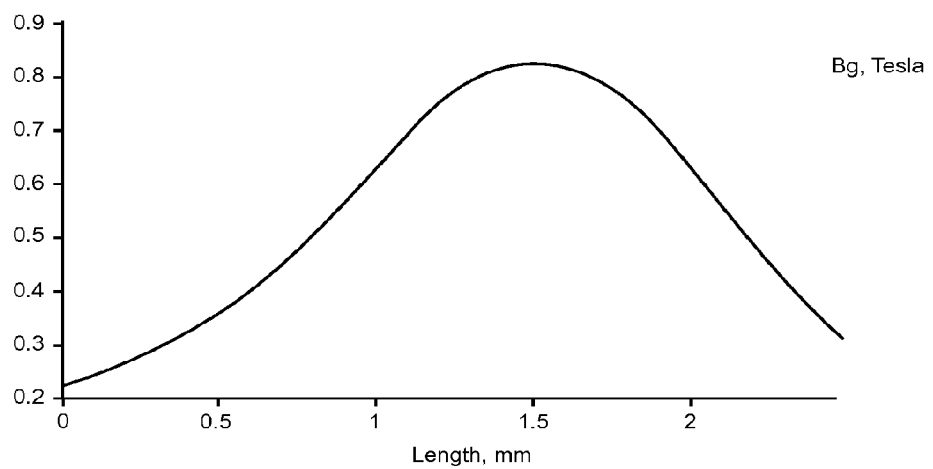

As discussed above, FIG. 2E is a graph of a simulation of air gap magnetic flux density vs. $B_g$/Tesla of the permanent magnet voice coil actuator having double-magnet topology 36 shown in FIG. 2C. In the case, the micro-speaker has a 10 ram voice coil diameter.

Figure 3A:
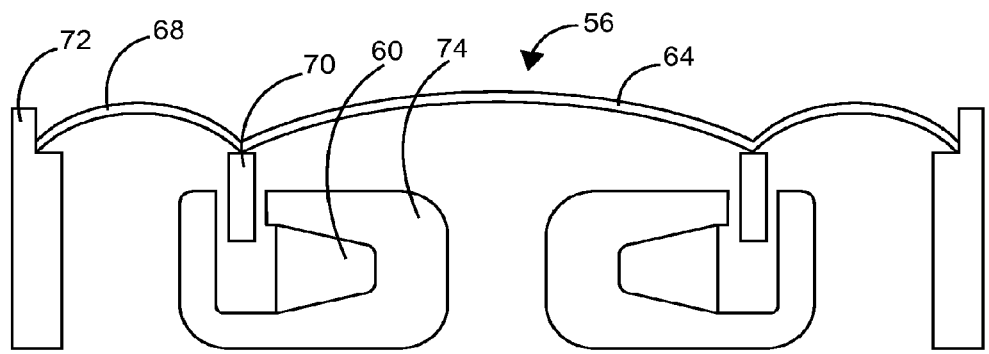
FIG. 3A is a cross-sectional view of an in-board field coil of an alternate embodiment of the magnet-less voice coil actuator.
Figure 3B:
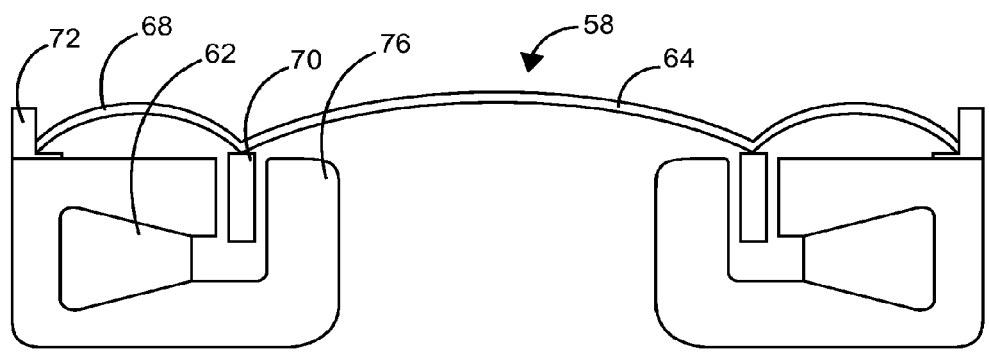
FIG. 3B is a cross-sectional view of an out-board field coil of alternate embodiment of the magnet-less voice cod actuator.

Turning to FIGS. 3A-3B, cross-sections of typical micro-speaker topologies using an alternate embodiment of the magnet-less voice coil actuator 56, 58 are shown. FIG. 3A is a cross-sectional view of an in-board field coil 60 of the alternate embodiment of the magnet-less voice coil actuator 56. FIG. 3B is a cross-sectional view of an out-board field coil 62 of the alternate embodiment of the magnet-less voice coil actuator 58. As shown, a micro-speaker dome diaphragm 64 and an outer half-torus ring suspension 68 are formed as one piece and bonded to a self supported voice coil 70 fabricated from bonded magnet wire. The outer edge of the ring suspension 68 is attached to a support basket 72 so that the voice coil 70 is suspended within the air-gap formed by the in-board and out-board pot core magnet structure 74, 76, typically press molded from an insulated powder metal ArcoLam 2FHR soft magnetic composite (SMC), within which in-board and out-board field coils 60, 62 use a high number of turns to create the magnetic flux through the core and across the air gap.

Figure 3C:
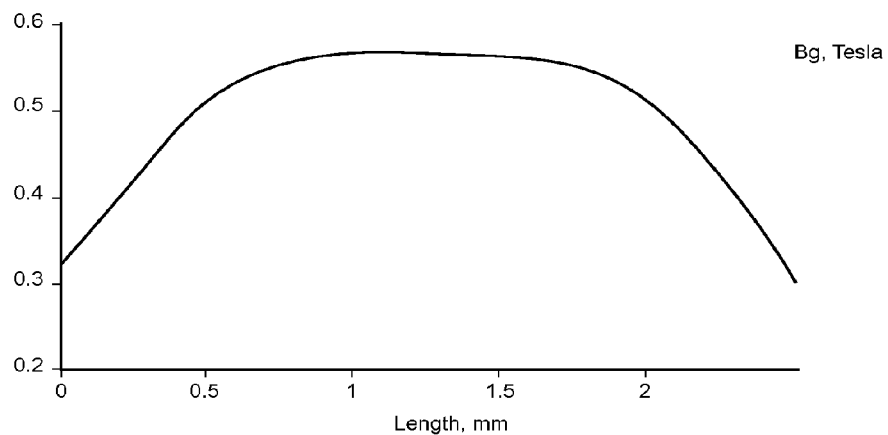
FIG. 3C is a graph of a simulation of air gap magnetic dux density $B_g$/Tesla of the out-board field coil embodiment shown in FIG. 3B.

Turning to FIG. 3C, a graph of a simulation of air gap magnetic flux density $B_g$/Tesla of the out-board field coil embodiment 58 shown in FIG. 38 is shown.

The preferred embodiment of the magnet-less electromagnetic voice coil actuator 10 presents an efficient magnet circuit with low magnet flux loss from stray fields using a pot core magnet structure 12 geometry for the electromagnet of the voice coil actuator 10. The axisymmetric geometry of the pot core magnet structure 74 described in relation to FIG. 3A, the more compact embodiment, the field coil 60 is on the in-board of the voice coil 70 and air gap and in the geometry described in relation to FIG. 38, which affords a higher motor force factor BL, the field coil 62 is out-board of the voice coil 70 and air gap. These are roughly analogous to the geometry described in relation to FIGS. 1A and 1B but with the very important distinction that the device shown in FIG. 3B is a fully shielded enclosed pot core magnet structure 74 whereas that shown in FIG. 1A is open to prevent shorting the permanent magnet circuit.

The air gap magnetic flux density $B_g$ for the pot core magnet structure topology is estimated as follows. To a first approximation it is assumed that magnetic flux density has the same value B ($B=B_g=B_c$) in the entire magnetic circuit and also that the cross-section area of the gap $A_g$ is equal to the cross-section area of the core $A_c$. From Ampere's law:

$NI_{fc}=H_cL_{eff}+H_gL_g=B_cL_{eff}/\mu_{eff}+B_gL_g/\mu_o$
but $\mu_{eff}>>\mu_o$ so $B_g=\mu_o NI_{fc}/L_g$ Wherein:
N—number of turns on the field coil
$I_{fc}$—field coil current
$H_c$—magnetic field strength in the ferromagnetic core
$L_{eff}$—effective magnet circuit length
$H_g$—magnetic field strength in the air gap
$L_g$—length of the air gap
$B_c$—magnet flux density in the ferromagnetic core
$\mu_{eff}$—effective permeability of the ferromagnetic core ($->10^3$)
$\mu_o$—permeability of free space ($=4\pi \times 10^{-7}$)
$A_c$—cross sectional area of core
$A_g$—cross sectional area of gap The voice coil Lorentz force $B_gL_{vc} \cdot I_{vc}=\mu_o NI_{fc}I_{vc}L_{vc}/L_g$ is now a function of the product of the currents in the voice coil and field coils ($I_{fc}I_{vc}$). To a second approximation the magnet flux density in the gap, $B_g$ can be increased by a factor of $A_c/A_g$ where $A_c$ is the effective cross sectional area of the core and $A_g$ that of the air gap, Though an approximation, this coil current product relationship is the key result that facilitates the present invention. In practice, finite element methods are used to optimize the geometry of the magnetic circuit in order to estimate and ensure that the magnetic flux density $B_g$ in the gap exceeds the typical $B_g$ obtained using comparable sized rare earth NdFeB permanent magnets at the designated peak field coil current $I_{fc}$.

In order to conserve material and maintain an approximately uniform magnetic flux density within the pot core magnet structure along the magnet circuit length, the cross sectional area perpendicular to the lines of flux should remain constant. This can be achieved by ensuring that $r_1/h_1=r_2/h_2=r_x/h_x$ where r is radius and h is height of contiguous structure as shown in FIGS. 3A and 3B. Starting from desired voice coil radius $r_{vc}$ and an gap height $h_g$ the optimum geometry for minimum material is determined. The overall radius $r_x$ and height $h_x$ of the actuator is varied to give the desired field toil resistance $R_{fc}$ and inductance $L_{fc}$ within design weight limits. Finite element magnet method magnetics is used to optimize the geometry, generally for maximum BL. To a first approximation the finite element solver for 2D "Finite Element Method Magnetics" ("FEMM 4") by David Meeker, Ph.D. is used to simulate static magnetic field and force response to DC current stimuli of the geometry. 3D time dependent finite element solver may be used to further improve the designs.

The embodiments of the invention shown in FIGS. 3A and 3B use a heavy, excessively overhung voice coil 70 for direct comparison with prior art micro-speaker topologies shown in FIGS. 2A-2C. The excessive stray fields around the air gap are used to some benefit in the devices shown in FIGS. 2A-2C. However, it is a poor design that wastes B & L and it is clear from FIG. 3C that to more efficient arrangement of the voice coil could be leveraged with this embodiment for as micro-speaker of similar topology by reducing the amount of voice coil wire that lies outside of the air gap. The sound pressure level (SPL) is proportional to $20\log 10(BL/M_{ms})$ this has a double effect on SPL.

The preferred embodiment of the magnet-less electromagnetic voice coil actuator 10 presents materials for the pot core magnet structure 12 with magnetic behavior that has a near linear response to the input audio or other actuating signal, low hysteresis and eddy current losses in the electromagnet structure and AC operation from DC to 20 KHz or other designated frequency limit.

In the prior art, the purpose of the permanent magnet is to maximize the static magnet gap flux density $B_g$ with the pole pieces set at or near saturation. For that reason the soft magnet material is generally taken as a low carbon or mild steel. ENA 1018 is common steel for these applications. To a first approximation this magnet gap flux density $B_g$ is fixed, and at low currents in the voice coil the system is linear. However as the voice coil current increases the AC behavior of the steel pole piece can become non-linear as the voice coil current induced eddy current and hysteresis losses come into play. In the prior art there have been many ad hoc techniques such as copper pole caps and laminated pole pieces for reducing these losses in permanent magnet voice coil actuators. In the preferred embodiment of the magnet-less electromagnetic voice coil actuator 10, because the magnet gap flux density $B_g$ in the gap is made to change with time it is important to choose a soft magnet material which is designed for AC operation at the design frequencies of the system which is from DC to 20 KHz for voice coil actuators for full range loudspeakers but could be DC to 1 KHz for voice coil actuators for low frequency loudspeaker drivers.

FIG. 4A is a graph of the hysteresis B-H curve for soft magnet compos (SMC) material ArcoLam 2FHR. This material consists of high purity iron powder with a specialized coating/lubricant system that minimizes hysteresis and eddy current losses over a range of frequencies up to 31 KHz. The powder is supplied as a press ready premix for low temperature die press molding into complex shapes. The curves are plotted from actual material data at elevated frequencies and clearly show the ability of this material to achieve high magnetic flux densities approaching 2.0T coupled with a flat loop with, very low magnetic flux density remanence $B_r$ and very low magnetic field coercivity $H_c$, indicating low hysteresis losses. The area enclosed by a B-H loop corresponds to energy loss. In addition, the bulk resistivity of this material is very high at 1300 µΩ-m compared to 0.47 µΩ-m for 3% Silicon steel used for low frequency transformers. This high resistivity promotes very low eddy current losses. Together these properties of high magnetic flux density saturation $B_g$, low hysteresis, and low eddy current losses define the soft magnetic material properties required for the pot core magnetic structures used in the magnet-less voice coil actuator 10 of the present invention.

FIG. 4B is a graph of the hysteresis B-H loops typical of hard and soft ferromagnetic materials. The figure is a generic series of B-H loops that illustrate the complex phenomenon of hysteresis in ferromagnetic materials. It shows the difference between permanent and soft magnetic materials with she latter sometimes defined as low magnetic field coercivity $H_c$, but also illustrates that low remanence $B_r$ is also as desirable property to ensure near linear response over a wide range of B and H. The remanence $B_r$ and coercivity $H_c$ is small for SMC Arcolam 2FHR whose magnetic hysteresis loop is shown in FIG. 4B with solid line 78. The remanence $B_r$ is large and coercivity $H_c$ is small for Soft-SiSteel shown in FIG. 4B with dotted lines 80. The remanence $B_r$ and coercivity $H_c$ is large for Hard neodymium (NdBFe) whose magnetic hysteresis loop is shown in FIG. 4B with broken solid line 82. A straight line 84 shows hysteresis curve for free space.

FIG. 4C is a graph of the hysteresis B-H curve for minor loops for Arcolam 2FHR. The figure shows schematically the phenomenon of minor hysteresis loops 86 which occur when the reverse magnetic field H is confined within one quadrant of the hysteresis loop diagram. The dotted line 88 shows initial magnetization curve for Arcolam 2FHR. In the embodiment the field coil current $I_{fc}$, which defines the applied magnetic field, is positive definite so that the hysteresis is confined to the first quadrant where B & H are both positive. The minor loops arc confined within the main B-H loop 90 as shown so the hysteresis losses can be made very low when the B-H loop is flat as in Arcolam 2FHR.

The B-H loop, as shown in FIGS. 4A and 4B for Arcolam 2FHR, must be flat with both low magnetic flux density remanence $B_r$ and low magnetic field strength coercivity $H_c$. This is because the hysteresis energy loss per unit volume is proportional to the area B-H loop traversed in a cycle. There are also energy losses in minor loops that occur when B-H curve loops over a small area of B & H within a quadrant as shown in FIG. 4C. In the preferred embodiment of the invention B and H are always positive so these minor loops occur within the main loop in the first quadrant where both B & H is positive. These minor loops are approximately miniature versions of the main loop and therefore the overall response of minor loop traverses in the material minors the main loop as far as hysteresis losses and linearity is concerned. So if the main loop is tint with low losses at AC then so will the minor loops.

It is not sufficient to have a soft magnetic material where only the magnetic coercivity $H_c$ is low. The magnetic flux density remanence $B_r$ must also be low for use in the preferred embodiment of the present invention where near linear response over a wide range or B-H curve is desirable. FIG. 4B shows hysteresis curves for typical hard and soft ferromagnetic materials. But it is not only hysteresis effects that must be considered. Eddy currents occur in a soft magnet material with high conductivity, such as metals, when a changing magnetic field in the material induces current flow in the material. These eddy currents, detailed by Lenz's law, oppose the changing magnetic field and thus dissipate energy as losses. This results in a nonlinear response of the induced magnetic flux density B to the applied field H. Reducing or eliminating eddy currents at the elevated frequencies used in audio is therefore just as important as managing hysteresis losses.

Ferrites, which are effectively insulators or more correctly, semi-conductors in the broad sense of conductivity, could also be used as the soft magnet material but their saturation magnetic flux density $B_s$ is in general too low to give $BL_{pk}$ values which could compete with NdFeB permanent magnets. The low cost soft magnet composite (SMC) Arcolam 2FHR is an insulated powdered iron composite which has mechanical and magnetic properties exceptionally suitable for the magnet-less electromechanical voice coil actuator 10 compared to the low carbon steel used in the prior art. A key parameter for use at elevated frequencies is high resistivity which for Arcolam 2FHR is 1300 μΩ-m, compared to typical tow carbon steel which is 0.20 μΩ-m, and 3% silicon electrical steel which is 0.47 μΩ-m.

In addition to having excellent soft magnet properties, powder metallurgical processing allows low cost compacting of SMCs such as Arcolam 2FHR into complex powder metal shapes without additional machining. This means that full use can be made of finite element methods for optimizing geometry of the pot core magnet structure.

The preferred embodiment of the magnet-less electromagnetic voice coil actuator 10 presents the use of a soft magnetic composite (SMC) material for the pot core magnet structure 12 which has Superparamagnetic like behavior with a near linear response to the input audio or other actuating signal, low eddy current and hysteresis losses in the electromagnet structure and AC operation from DC to 20 KHz or other designated frequency limit.

FIG. 5 is a graph of the B-H curves showing hysteresis phenomena of ferromagnetism (steel & SMC) 96, 94, paramagnetism 98, and superparamagnetism 100. The figure shows schematically the B-H curves for ferromagnetic materials based on pure iron Fe, other materials showing paramagnetism which do not exhibit hysteresis, and superparamagnetism for use in new ideal, not yet commercially realized SMCs (No Hysteresis, Remanence $B_r$=0 and Coercivity $H_c$=0). It also shows schematically the free space contribution 92 to all the materials' magnetization which when added to the internal magnetization, gives the total plotted magnetic flux density B. In particular, it illustrates the phenomenon of superparamagnetism which can allow the realization of ideal Soft Magnetic Composites (SMC) made from pure insulated Fe nano particles which can achieve high saturation magnet flux densities without hysteresis and thus near perfectly linear response.

The currently available ferromagnetic SMCs such as Arcolam 2FHR used in the embodiments described herein have finite magnetic flux density remanence $B_r$ and magnetic field intensity coercivity $H_c$. These parameters are low compared to low carbon steels and other soft magnet materials such as Silicon Steel commonly used in the audio frequency range, but they do have hysteresis losses and resultant nonlinear behavior. It would he advantageous to use a superparamagnetic material equivalent of the SMC Arcolam 2FHR.

As shown in the B-H Loops of FIG. 5, Superparamagnetism is characterized by as linear response for B-H curves, large saturation magnetization $B_s$, and no hysteresis $B_r$=$H_c$=0. The requisite SMC would he composed of insulated Fe nano particles or other ferromagnetic (or ferrimagnetic) material composition with maximum saturation flux density $B_s$ comparable to Fe for which typically $B_s$=1.6T. The dielectric insulation thickness would be optimized to provide low eddy currents such that the hulk resistivity of more than about 100-1000 μΩ-m and the nano particle size would be optimized to between 10-25 nm such that the superparamagnetic behavior had an operational temperature over 150° C. and the Neel relaxation times were well below 50 μs to facilitate audio bandwidth (20 KHz+) frequency of operation of the voice coil actuator electromagnet made from the superparamagnetic SMC.

The preferred embodiment of the magnet-less electromagnetic voice coil actuator 10 presents electronics signal processing which gives a linear response of the actuation force in both amplitude and frequency to the incoming audio signal and which has to bandwidth from DC to 20 KHz.

The incoming time dependent audio electrical signal F(t) is processed and partitioned into an amplified voice coil current $I_{vc}$ signal G(t) and field coil current $I_{fc}$ signal H(t) with the field coil current signal H(t) carefully bandwidth limited to take into account the crest factors of audio signals as well as the increased inductance of the many turns N on the field coil which may be required to achieve the target air gap flux density $B_g$ at the designated peak field coil current $I_{fc}$. Field coil inductance also sets an upper limit on H(t) because the field coil acts as a low pass 1st order filter with $2\pi fL=R$ (where f is the −3 dB corner frequency, L is the field coil inductance and R is the field coil resistance). The voice coil current $I_{vc}$ is processed to complement the bandwidth limited field coil current $I_{fc}$ so that the resultant Lorentz force on the voice coil i.e. the motor force, is a faithful amplified representation of the incoming audio signal F(t)=G(t).H(t). Compensation must be made for any group time delays introduced by bandwidth limiting filters. In practice then H(t)=H(t+dt1) and G(t)=G(T+dt2) where dt1 and dt2 are positive or negative group delay time adjustments so that the actual applied magnetic field strength due to the field coil current $I_{fc}$ generates a magnetic flux density $B_g$ in the air gap which is synchronous with the voice coil current $I_{vc}$. The result is an integrated audio amplifier and voice coil actuator system that, for comparable size and weight, outperforms rare earth NdFeB permanent magnet voice coil actuator systems in bandwidth and efficiency for any loudspeaker driver topology and scale.

The preferred embodiment of the magnet-less electromagnetic voice coil actuator 10 works by making H(t) positive definite and derived from a bandwidth-limited version of F(t). In particular a square root derived function is shown to be a candidate function.

The signal processing is as follows:

In general F(t)=|X(t)|.(|F(t)|/|X(t)|).SGN(F(t))

Wherein: H(t)=|X(t)| and G(t)=(|F(t)|/|X(t)|).SGN(F(t)). In order to ensure G(t) doesn't 'blow up' then either X(t) is DC, DC stepped or X(t) everywhere vanishes to zero slower than F(t). It is desirable to also ensure that G(t) lies within the original bandwidth of F(t). An example of a well behaved X(t) is the square root function of the incoming signal.

H(t)=|F(t)|½ and G(t)=(|F(t)|½).SGN(F(t))

normalized with unit constant.

FIG. 6A is a graph showing signal processing F(t) for an incoming bipolar audio signal. FIG. 6B is a graph showing signal processing H(t) for a positive definite field coil signal. FIG. 6C is as graph showing signal processing G(t) for a bipolar voice coil signal. FIG. 6D is a graph showing signal processing H(t)*G(t) for a reconstructed bipolar actuation force signal. FIG. 6E is as graph showing signal processing H(t) for a positive definite field coil signal with DC offset 0.25 added, FIG. 6F is a graph showing signal processing G(t) for a bipolar voice coil signal processed from the DC offset signal. FIG. 6G is a graph showing signal processing H(t)*G(t) for a reconstructed bipolar actuation force signal processed from the DC offset signal. DC offset in H(t) does not carry through to output H(t)*G(t) since the signal G(t) compensates for DC in H(t). FIG. 6H is a graph showing the square root signal processing as in FIGS. 6A-6G with real audio speech signal. FIG. 6I is a graph showing the square root signal processing as in FIGS. 6A-6G with real audio speech signal processed with a step function.

Turning to FIGS. 6A-6G, two examples of an embodiment of the signal processing using the square root function are shown. A pure sine wave signal is used for input. In the second case a DC offset is added to the field coil signal H(t) and the processing shows that it does not affect the outcome. This DC can be stepped in time or fixed. An example of a well-behaved step function is given by the following equation and shown in FIG. 6I.

H(t)=$F_{max}$.INT((s|F(t)|/$F_{max}$)+1) and

G(t)=(|F(t)|/|H(t)|).SGN(F(t)) normalized with unit constant.

Where s is the number of voltage steps, $F_{max}$ the maximum allowed value of F(t), usually the voltage rail, and the minimum value of H(t) is non-zero=$F_{max}$/s. The s step heights generated above are equal in this algorithm but in principle could be varied. When DC is fixed, i.e. H(t)=$V_{dd}$ then the efficiency of the field coil electromagnet decreases.

It is sometimes desirable to have semiconductor devices operate with to quiescent current through to the output load. This is particularly the case in this instance where H(t) is made positive definite and there is no zero crossing signal. FIGS. 6H and 6I show signal processing for real world speech and music data for the square root function and stepped DC function respectively.

For analog linear circuit designs which do not have ready access to an electronic digital signal processor (DSP), the translinear (TL) principle can be exploited for MOSFETs operating in the sub-threshold region to generate convenient square rooting circuits with only a couple of transistors. The signal processing technique described above has the advantage of providing a large family of functions which can compress the dynamic range of the incoming signal and that has the beneficial side effect of increased signal to noise and system dynamic range. Log functions are also viable, which again provide compression and rely on the TL principle, but in this case, for bipolar junction transistors (BJTs). The DSP required for any of the above schemes is readily implemented in a device like the MAX98095 Triple Interface CODEC with FLEXSOUND™ from Maxim integrated Products, Inc.

The preferred embodiment of the magnet-less electromagnetic voice coil actuator 10 presents signal processing which uses negative feedback to linearize the actuation force so that it is a faithful representation of the incoming audio signal. The embodiments described thus far are all open loop systems which means that the electrical driving signal F(t) is not compared to the actuator output driving the loudspeaker diaphragm or to its displacement with time.

FIG. 7 is a functional block diagram and general circuit description of a normal open loop amplifier drive system with voltage feedback for a magnet-less voice coil actuator class-D amplifier 102. Mode 1 operation or an open loop here means that transducer sensor feedback is not employed but both voltage and current feedback may be applied. Current feedback is used primarily for over current protection. The input differential signal, F(t) is AC coupled and amplified by a differential amplifier module 104. The differential output is fed to a CODEC and signal processing module 106 which can be integrated onto the IC or externally processed. This module 106 generates H(t), the positive definite field coil drive signal and G(t), the bipolar voice coil signal. H(t) and G(t) are fed into a feedback error module 108 which can monitor voltage feedback and current feedback from the IC output, and optionally transducer sensor output feedback for signal correction. The differential outputs of the error amplifier module 198 is fed to a Pulse Width Modulation (PWM) module 110 containing signal comparators and discriminators which combine with a high frequency ramp signal from an internal oscillator module 112 to generate the PWM outputs. The PWM outputs H(t) and G(t) are fed to a MOSFET H-bridge output stage 114, 116. The H-Bridge outputs of G(t) drive the voice coil 118 in differential or BTL mode. The H-Bridge outputs of H(t) are combined in parallel as single ended driver of the field coil 120. Reservoir capacitors isolate and provide storage to facilitate recirculation of the single ended field coil current.

Because the loudspeaker is an acoustic device and ultimately couples to the user via sound pressure waves in air, it is understandable that in general, acoustic and audio engineers do not prefer loudspeaker amplifier systems with motion feedback, which corrects the time dependent displacement of the voice coil or diaphragm. Instead they prefer directly voltage driven open loop systems where voltage feedback is used only at the amplifier stage to ensure that the voltage fed to the voice coil is an accurate representation of the input signal. They then measure the resultant Sound Pressure Level (SPL) of a loudspeaker under test in a known environment e.g. an anechoic chamber, in response to a well-chosen input signal F(t) at a specified power level, usually 1 watt into 8 Ω measured at 1 m. The voice coil magnet system of a loudspeaker is a current device and it may be surprising at first sight that the current through the voice coil is not used for amplifier feedback. This because the loudspeaker's electrical impedance is coupled directly to the acoustic and mechanical resonances of the loudspeaker and its enclosure and as a result voltage drive has been found to reproduce better fidelity than current drive.

It should be noted that the field coil impedance is generally unaffected by acoustic or mechanical resonances and therefore current feedback i.e. transconductance mode, may be used for amplifier feedback for the field coil signal H(t). However, in the past and in the prior art there has been the use of motion feedback loudspeaker or servo systems and this should he a consideration because signal processing is an integral part of the invention and can be extended for motion feedback. In a first embodiment of the invention using feedback there is available a wide range of sensors which utilize optical, magnetic, piezo, MEMS, or other type transducers or accelerometers which can provide time dependent voice cod displacement information to correct the actuator output. This data, which may be analog or digital, is compared to the incoming audio signal in order to adjust the voice coil signal G(t) and/or the field coil signal H(t) in real time so the actuator force and time dependent displacement is an accurate representation of the incoming audio signal F(t).

The magnet-less voice coil actuator class-D amplifier 102 operating in Mode 2 shows the functional block diagram of the standard magnet-less voice coil actuator with motion sensor feedback, as described above, into the error amplifier module 108 to linearize and correct the time dependent actuator displacement by altering the voice coil current generated by G(t).

In another embodiment employing transducer sensor feedback, a Hall Effect sensor, search coil or other magnetic field sensor provides time dependent or static information on the magnetic flux density in the voice coil air gap $B_g$. This data which may he analog or digital is compared to the required field coil signal H(t), which may be DC i.e. static, or stepped DC, and the field coil current is adjusted to ensure that $B_g$ is linearly related to the H(t).

The magnet-less voice coil actuator class-D amplifier 102 operating in Mode 3 shows the functional block diagram of the standard magnet-less voice coil actuator with magnetic sensor feedback, as described above, into the error amplifier module 108 to linearize and correct air gap flux density $B_g$ by altering the field coil current generated by H(t). In a variation of this embodiment, the off-state of a MOSFET half-bridge with both switches off, is used to control storage of the magnetic energy in the air gap. This is used with the feedback system as shown in FIG. 7 operating in Mode 3, which monitors the air gap magnetic flux density $B_g$ with a sensor. It uses three states of the half bridge to hold, with MOSFET switches off, or charge with MOSFET OPH to $V_{DD}$ on, or discharge with MOSFET OPL to $V_{ss}$ (GND) on, in order to move energy stored in field coil inductance from or to the power supply reservoir capacitors in the single ended PWM or Class-D drive topology.

Throughout the analysis thus far the signal processing H(t) is taken as positive definite and G(t) as bipolar. In alternative embodiments the polarity could in general be reversed with G(t) positive definite and H(t) bipolar. Although FIG. 7 shows a differential analog input there would be some benefit in noise rejection in having a digital input that interfaced directly into the CODEC & Signal Processing module 106.

Another embodiment of the magnet-less electromagnetic voice coil actuator presents signal processing which uses the voice coil as a search coil transducer to calibrate the air gap magnetic flux density $B_g$ by measuring the magnetic field induced in the voice coil when in the field coil is stimulated with a known test pattern filed coil current $I_{fc}$. This can be used at the time of manufacture and or periodically during use to compensate for component ageing by auto calibration on start up.

A voltage V is induced in coil according to Lenz's law as follows: $V = -d\phi/dt$ where $\phi = B_g A_{vc}$ is the magnetic flux through the voice coil of area $A_{vc}$, so $V_{cal} = -A_{ved} B_g/dt$ where $V_{cal}$ is the calibration induced voltage, and $B_g = B_g(t) = H_{cal}(t)$ is a field coil current $I_{vc}$ time dependent function chosen to stimulate the device.

Under normal conditions the voice coil is driven by the class-D amplifier through bridge-tied load (BTL) output terminals. It is usual to monitor this output directly in the amplifier circuit the negative feedback as well as for current limiting. At calibration these inputs may be diverted to circuitry that measures the induced voltage $V_{cal}$. The correction parameters are computed externally or internally and are stored in non-volatile memory in the amplifier circuitry for use during operation with other parameters such as speaker equalization. FIG. 7 shows the functional block diagram for the class-D amplifier with differential analogue audio inputs circuitry for this embodiment of the invention.

Calibration also serves the important purpose of accurately determining the time delay of the signals processed through the field coil H(t) relative to the signals through the voice coil. In general these group delays could be frequency dependent and for the highest fidelity would need compensation in H(t). The calibration process could also be used to determine the bandwidth of the H(t) signal when processed through the field coil so that compensation can be applied to the G(t) signal to recover the full bandwidth F(t) signal. In addition the time delays may be used to aid the complexity of an encryption process to protect audio works of art by preventing explicit revelation of the original signal F(t) and attempts to reconstruct. F(t) from H(t) and G(t) for the purpose of copyright theft.

In normal operation H(t) is positive definite but it may he desirable to have $H_{cal}(t)$ bipolar to demagnetize and fully exercise the field coil and pot core magnet structure over full hysteresis cycles which would require a full H-bridge or bridge-tied load (BTL) output would he used. In normal use they would he switched to operate in parallel to provide half bridge or single ended positive definite drive signal for H(t) with increase current capacity This is desirable for the field coil class-D drive amplifier.

The present invention presents a system and method to integrate the magnet-less voice coil actuator 10 with the electronic integrated circuits to provide as loudspeaker drive motor which can receive low level analog or digital noise free audio signals and power.

It is customary to have the loudspeaker and driver and audio amplifier as separate components that are integrated by audio system engineers into products and systems. Loudspeaker equalization, which is generally required to compensate for the enclosures, is more recently carried out by DSP either within the amplifier ICs or codecs such as the combination MAX98400B Class D-amplifier and MAX98095 Triple Interface CODEC. Field coils have not been used in loudspeakers and it will be difficult to train and/or persuade acoustic and audio engineers to adapt. It is therefore desirable to provide the magnet-less voice coil actuator in a more convenient form to the supply chain.

The amplifier ICs with signal processing architecture may be integrated with the voice coil actuator, preferably including voice coil wound on former if required. This is supplied as an assembly to loudspeaker manufacturers to integrate diaphragms and baskets as finished products to he sold to system integrators. Speaker equalization can only be finalized once the enclosure is known so software is provided through the loudspeaker manufacturer to allow the system integrator to load speaker equalization parameters into the non-volatile memory in the voice coil actuator.

The preferred embodiment of the magnet-less electromagnetic voice coil actuator 10 presents efficient electronics amplification of audio signals using PWM Class-D amplifiers for driving both the voice coil and field coil.

The bipolar voice coil signal G(t) is driven by an efficient bridge tied load class-D amplifier in the same way as the prior art but with the advantage that the dynamic range is effectively compressed by the choice of H(t) and G(t). The positive definite field coil signal H(t) is driven directly by an efficient single ended PWM or class-D amplifier without the blocking capacitor usually used for single ended drive of loudspeakers with a single rail voltage.

FIG. 8A is a graph showing a typical Pulse Width Modulation Scheme for a Single Ended Class-D amplifier. Schematically, the incoming sine wave test signal is compared to an internal triangle oscillator ramp signal and the two state output of a comparator is the PWM signal fed to the full or half H-bridge outputs depending with the drive is single ended of differential BTL. The input audio signal is connected to the input of a comparator, in this case the non-inverting input, and a triangular wave ramp signal at a frequency much higher than the audio bandwidth limited signal, typically 300 Khz to for 20 Khz audio, is connected to the other input of the comparator. The output of the comparator is a square wave with positive pulse widths proportional to the varying input signal. The incoming audio signal is recovered when the output square wave signal is bandwidth limited through a low pass filter with a cut-off much less than the ramp signal.

In general a BTL amplifier is capable of twice the voltage swing of a single ended amplifier on the same voltage rail. The field coil resistance $R_{fc}$ and number of turns N is adjusted so that the field coil current $I_{fc}$ has a peak value based on the voltage rail available and the required peak air gap flux density $B_g$. The voltage rail can be boosted with a charge pump or switch mode dc-dc converter but it makes more sense to keep $R_{fc}$ as low as possible. This is because the field coil current is made to recirculate between the field coil inductance and voltage rail reservoir capacitors minimizing ohmic energy losses by using low field coil resistance $R_{fc}$ and MOSFETs with low $R_{DS(ON)}$. In the case of a typical voice coil resistance $R_{vc}$=8 Ω the field coil resistance should be set lower at say 2 Ω to 4 Ω or even 1 Ω if $R_{DS(ON)}$ can be made less than approximately 100 mΩ.

With prior art permanent magnet actuators, the actuator force is proportional to $I_{vc}$. In the presently presented device the actuator force is proportional to $I_{vc} \cdot I_{fc}$. It is clear that in the limit of high power the invention can he made far more efficient than the prior art. By exploiting the crest factors of 15 dB to 25 dB for normal speech and music, the high power limit can be leveraged to provide loudspeaker amplifier systems with higher peak powers at lower distortion. The huge efficiency improvement at higher powers is shown graphically in FIG. 8B fur small speakers and FIG. 8C for large speakers.

FIG. 8B is a graph showing total power P2 for magnet-less voice coil actuator and P1 for conventional voice coil actuator as a function of conventional voice coil current $I_{vc}$ for small loudspeakers. In this case the field coil is chosen so that at a peak field coil current $I_{fcpk}$ of 1 amp the air gap magnetic flux density $B_g$ is typically that of the conventional voice coil actuator (VCA) set by a permanent magnet. The calculations show that the total power in the conventional VCA which varies as the square of the voice coil current exceeds the power of the magnet-less voice coil actuator (ML-VCA) when the voice coil current reaches about 1.25 amps. Because the ML-VCA power varies linearly with current by 2 amps of voice coil current the power dissipated is only half the power of the conventional. This means that the ML-VCA has significantly more headroom than a conventional VCA. This is very important because the fact that the crest factors of music and speech vary between 15 dB and 25 dB means that the practical distortion limit for this type of content is determined not be the average power capability of the VCA but by its peak power capability. In this case a 1-watt average power system should have a headroom of 10 to 15 watts.

FIG. 8C is a graph showing total power P2 for magnet-less voice coil actuator and P1 for conventional voice coil actuator as a function of conventional voice coil current $I_{vc}$ for large loudspeakers. FIG. 8C is similar to FIG. 8B but for larger speakers where the power ratings are an order of magnitude higher at 100 to 200 watts peak power. in typically 1 KW PA systems the performance increase is even more dramatic.

In practice it is distortion at peak power that sets the real limit of loudspeaker amplifier systems. This capacity for higher peak power before distortion allows the present invention to outperform rare earth NdFeB permanent magnet voice coil actuator loudspeaker systems of comparable size and weight in bandwidth and efficiency. The amplifier required for any of the above schemes could typically be implemented with the MAX9840013 15+15 watt/4 Ω Class-D stereo amplifier IC within the power limits of that device.

The preferred embodiment of the magnet-less electromagnetic voice coil actuator 10 presents efficient recirculation of the magnetic energy generated by the field coil 14 and stored in the voice coil air gap. The pot core magnet structure 12 with an air gap is a very efficient method of storing energy.

The PWM or class-D amplifier(s) which drive the field coil current $I_{fc}$ with signal H(t) generates the magnetic energy $W_g = L_{fc} I_{fc}^2 / 2 = B_g^2 V_g / 2 \mu_c$ (where $L_{fc}$ is the field coil inductance and $B_g$ is the air gap flux density integrated over the air gap volume $V_g$). This magnetic energy is stored primarily in the air gap and is re-circulated between the field coil inductances and the voltage rail reservoir capacitors as a bi-product of a well-designed single ended class-D or PWM amplifier using MOSFET switches which allow bi-directional current flow between the load and reservoir capacitors. For single ended or half bridge drive class-D amplifiers this is sometimes problematic at low audio frequencies between 5 Hz and 100 Hz and can lead to the phenomenon power supply pumping but in this case it is leveraged to enhance the efficiency of the field coil amplifier system.

Power supply pumping is an effect caused by single-ended Class-D amplifiers in which current is fed back into the supply rail during switch transitions. Most power supplies can only source current; thus the main power supply reservoir capacitors must be large enough so they can accept this current When it is pumped into the supply node. The key to this phenomenon is to have sufficiently large reservoir capacitors $C_{psu}$ to allow the current to recirculate without increasing the voltage rails. This is quantified as follows:

$$\Delta V_{dd} = V_{dd}/(2\pi^2 f_0 R_c C_{psu})$$

Wherein: $f_0$ is the lowest frequency component of H(t), $V_{dd}$ is the power supply voltage rail, $C_{psu}$ is the power supply reservoir capacitors, $R_{fc}$ is the Field Coil resistance, and $\Delta V_{dd}$ is the approximate power supply pumping voltage increment.

When compared to single ended drive PWM or Class-D, the differential BTL drive using a full bridge MOSFET used for the voice coil drive Class-D amplifier does not have an issue with power supply voltage pumping. Although there is recirculation of current it is less because the inductance of the voice coil is kept low and in any event the pumping is balanced by the double ended drive topology and the bipolar nature of the signal G(t).

The ohmic losses, $I_{fc}^2 R_{fc}$ are minimized by making the voice coil resistance $R_{fc}$ low and using MOSFET switches with low $R_{DS(ON)}$. The field coil inductance and field coil resistance are co-dependent and are optimized by making use of the fact the field coil 14, 62 is stationary and in the out-board pot core magnet structure 12, 76 of FIG. 1A or FIG. 3B there is relatively large space available by design to maximize the field coil inductance $L_{fc}$ as well as minimize field coil resistance, $R_{fc}$.

The off-state of a MOSFET half-bridge, with both switches off, can also allow storage of the magnetic energy in the air gap to improve efficiency even further as described earlier. This can be used with a feedback system which monitors current flow in the field coil or more directly, the air gap magnetic flux density $B_g$ with a sensor which allows three states hold with MOSFET switches off, charge or discharge from power supply reservoirs capacitors in the usual single ended PWM or Class-D drive.

It is important to appreciate that if a class B or class AB amplifier is used to drive the field coil with the H(t) signal then all of the energy $W_g$ stored in the air gap is dissipated in the amplifier and $R_{fc}$ when H(t) returns to zero. It is only high frequency PWM or Class-D amplifiers that have the capacity to limit energy loss to ohmic losses in $R_{fc}$ and switching losses in $R_{DS(ON)}$. Also, only MOSFET switches which are intrinsically bidirectional in the on state and can give additional efficiency through recirculation of energy between the field coil inductance and the reservoir capacitors.

The present invention 10 provides weight reduction using aluminum field coil magnet wire. The drawback of using a large volume of copper for the field coil 14 to maximize the field coil inductance $L_{fc}$ and minimize its resistance $R_{fc}$ is that the overall weight of the device can be excessive. In these cases aluminum or copper clad aluminum is considered for use as the magnet wire for the field coil to reduce weight. For the present invention 10, and for prior art voice coil actuators the choice of copper clad aluminum for the voice coil magnet wire is typical for high performance or extended bandwidth loudspeaker voice coils. The voice coil 16 is to moving mass, which directly affects the SPL efficiency of a loudspeaker. The ratio of the density of Copper:Aluminum:Steel is $8.96:2.7:7.86 \times 10^3$ Kgm$^{-3}$ and the ratio of the conductivity of Copper:Aluminum is 58:38 MSm$^{-1}$, from which the weight and ohmic loss trade off can be evaluated.

The preferred embodiment of the magnet-less electromagnetic voice coil actuator 10 presents a system and method to extend the axisymmetric topology from a circular to an oval or racetrack topology wherein the cross sections appear identical to those given herein but the voice coil, field coil and pot core magnetic structure takes on a high aspect ratio oval shape of more than approximately 2:1 to approximately 10:1.

Many applications for loudspeakers such as flat TVs have restrictions in certain dimensions which benefit from having loudspeakers with high aspect ratio diaphragms. In these applications it is advantageous to have a voice coil that is an elongated racetrack rather than cit flan The devices and methods described above are all readily ported to this structure.

Another embodiment of the magnet-less electromagnetic voice coil actuator 10 presents a system and method of encrypting copyrighted and other high resolution audio works of art to bridge the so called analog hole or analog loophole which has thus far been considered impossible to circumvent in audio. This is made possible in embodiments of this invention due to the dual signal transfer using F(t)=H(t).G(t) that can effectively mask the original work of F(t) right up to the point of acoustic output.

It is reported that media publishers who use digital rights management (DRM) to restrict how a work can be used perceive the necessity to make it visible and/or audible as a 'hole' in the control that DRM otherwise affords them. The analog hole (also known as the analog loophole) is considered an inevitable weakness in copy protection schemes for copy protected audio and video electronic works of art in high-resolution digital formats that must eventually be reproduced using analog means. An embodiment of this invention can make this an incorrect assertion for high-resolution audio works of art. Once digital information is converted to a human-perceptible (analog) form, it many seem a relatively simple matter to digitally recapture that analog reproduction in an unrestricted form, thereby effectively circumventing restrictions placed on copyrighted digitally distributed work. However if this so called 'hole' can be restricted to capture by low resolution methods emulating the eye and ear i.e. camera and microphone—then in fact high resolution digital copyrighted works can be made secure.

In the case of video with systems such as Blu-ray, which use high definition multimedia interface (HDMI) with High-bandwidth Digital Content Protection (HDCP) encryption embedded in a display receiver for the highest resolution reproduction, which has the effect that analog copying can be effectively restricted to the unsatisfactory method of using cameras to emulate the eye. In the case of audio it is generally straightforward to intercept the acoustic output at several high fidelity electronic nodes in the audio chain through to the loudspeaker. Unlike the case of video, this is an analog loophole that can only be bridged if the copying is restricted to using the unsatisfactory method of a microphone when the work is reproduced. Embodiments of the invention can prevent direct access to a high fidelity electronic node in the audio chain by making the H(t) and G(t) signals part of an encryption chain so that attempts to intercept the signals and recombine them are no better than using, a microphone. Even though a user may have access to electronic nodes at the H(t) and G(t) signal, these signals are not synchronous in time and have distinct signal group delays associated with the impedances of the field coil and voice coil. The group delays are embedded in the signal and not easily extracted.

Musicians rightly complain that since the advent of the post compact disc digital music distribution, originally Napster, and now iTunes and Amazon, they have lost billions of dollars of royalty revenue due to theft of copyrighted material, and moreover suffered devaluation of their works of art. An embodiment of the invention can return to the era of the Permanent Use and Resale License (PURL) that ended with the popularization of the compact disc, which enabled trivially easy digital copying.

Copyrighted high-resolution audio works of art can utilize a secure digital format available for SD and microSD cards. High quality audio reproduction devices such as loudspeakers and headphones based on the magnet-less voice coil actuator may be constructed with the decryption algorithms embedded in the ML-VCA IC (Magnet Less—Voice Coil Actuator Integrated Circuit) using the H(t) and G(t) dual signal paths and their group delays for encryption. The SD cards may either be inserted directly into the audio reproduction device or digital data with encryption transferred by wire or wirelessly from the SD card to the ML-VCA IC. Low resolution, i.e. FM quality 64 Kbs MP3 versions of the audio works of art can be made available on the SD cards without encryption.

Using the encryption scheme described herein, it is possible for musicians and publishers to be certain that every high-resolution listening experience has been paid for by a PURL user. And this experience can be lent or given away but cannot be freely duplicated.

The present invention 10 presents a system and method to extend the magnet-less methodology to other voice coil actuator topologies with linear motion and permanent magnet motors with rotational motion.

Linear voice coil actuators are used as positional devices in many applications such as hard disc and optical drives. Where these motors use permanent magnets, the methodology used here of replacing the permanent magnet by an electromagnet with an optimized pot core magnet structure and signal processing to partition the drive signal F(t) into two components H(t) and G(t) can be extended to make these other motors magnet-less devices. However there are generally one or both of two conditions where the magnet-less methodology outperforms the permanent magnet systems. Firstly, at very high powers because of $I_{vc}^2$ versus $I_{vc}.I_{fc}$ relationship means that quadratic $I_{vc}^2$ relationship grows more rapidly than the linear $I_{vc}.I_{fc}$ relationship. Secondly, intermittent operation such as with high crest factor signal profiles such as occurs in music and speech signals coupled with PWM or Class-D efficient drive provide overall better performance. i.e. before high level signal clipping and distortion.

FIG. 9A is a cross-sectional view of an axisymmetric schematic depiction of a PCMS (Pot Core Magnet Structure) rotational motor 122 according to an alternate embodiment of the present invention. The PCMS motor 122 comprises a pot core magnet structure 132 fabricated using, a soft magnetic composite ArcoLam 2FHR. The pot core magnet structure 132 includes field coil turns 134 made with 99.9% aluminum wire and as rotor 124 comprising a 4 layer 14 AWG copper magnet wire radially wound in an air gap 136 with flux free coil return cages 126. A hollow rotor shaft 138 comprises high strength alloy. The upper and lower bearings 140 are preferably made with lightweight silicon nitride ceramic and are attached with a bearing support 142.

The design is a doubly fed PCMS rotational motor capable of producing 250 HP at 10,000 RPM, In a rotational motor design the Torque T (Nm) on the rotor should be evaluated. In the case of the doubly fed PCMS motor, this can be evaluated directly as follows.

The radial force on the rotor is the Lorentz force and is given by:

$F=B_g.I_{rc}.L_{rc}$

Wherein $B_g$ (T, Tesla) is the magnetic flux density in the air gap containing the radially wound rotor coil, $I_{rc}$ (A, Amps) is the peak current through the radial elements of the rotor coil in the air gap, $L_{rc}$ (m, meters) is the total length of wire in the air gap subjected to $B_g$.

The magneto motive force $F_m$ which drives the magnet flux ($\phi$) through pot core magnet system's air gap according to Ampere's law is given by:

$NI_{fc}=H_c.L_c+H_g.L_g$

Wherein: N is the number of turns of the field coil encircling the core, $I_{fc}$ (A, Amps) is the field coil current encircling the core, $H_c$, $H_g$ (Am-1, Amps/meter) are the magnetic field strengths, and $L_c$, $L_g$ (m, meters) are the effective lengths of the magnetic circuit through the core and air gap respectively.

Using the identity $B=\mu_r\mu_oH$ and assuming that the flux density through the core is constant (i.e. effective area is constant) then:

$NI_{fc}=B_c.L_c/(\mu_r\mu_o)+B_g.L_g/\mu_0$

But the relative permeability $\mu_r>>1$ for the ferromagnetic core so the first term is negligible in comparison to the second so:

$NI_{fc}=B_g.L_g/\mu_o$

This gives the gap flux density $B_g$ which can be substituted in the Lorentz force equation to give:

$F=\mu_o.N.I_{fc}.I_{rc}.L_{rc}/L_g$

This force acts radially on the rotor coil and manifests itself as rotational torque T which is given by:

$T=F.<R>$

Where $<R>$ is the average or summed radius over which the force acts and is given by:

$<R>=(R_{max}+R_{min})/2$

Where $R_{max}$ and $R_{min}$ are the outer and inner radii of rotor coil. In this case 125 mm and 75 mm gives $<R>=100$ mm, so:

$T=\mu_0.N.I_{fc}.I_{rc}.(L_{rc}/L_g).<R>$

Where for the purpose of calculations $\mu_o=4\pi\times10^{-7}$ is a fundamental constant, the permeability of free space.

In order to achieve wiring of the rotor 124 in only one radial direction, the rotor coil windings are returned as in FIG. 9A through a flux free cage 126 which means that at least ½ of the winding is not subject to the Lorentz force induced torque, e.g. $L_{rc}->L_{rc}/2$. Accordingly the torque is modified as follows:

$T=\mu_o.N.I_{fc}.I_{rc}.(L_{rc}/2L_g).<R>$

The design process for a PCMS motor is an iterative and parametric process using the above equation as a guide. This process employed below to estimate the motor parameters needed to achieve the design peak power goal of 250 HP at 10,000 RPM, the result of this process is shown in FIG. 9A.

In general, the maximum induction attainable in a pot core magnet structure using pure iron Fe cores is about 1.0 to 1.5 Tesla. The number of close packed layers of the magnet wire determines the an gap length Lg. Copper AWG 14 with a diameter of 1.68 mm was selected in this case, as well as a 4 layer rotor coil comprising 2 layers on each half of the rotor cages. The number of turns N on the field coil may be calculated as follows:

$NI_{fc} = B_g \cdot L_g / \mu_o$

If B=1.5 T, $L_g$=4 layers×1.7 =6.8 mm, and $I_{fc}$=25 A peak current, then N=324 turns on the field coil to give $B_g$=1.5 T.

A 250 HP motor turning at 10,000 RPM requires a torque of 178.0 Nm. It is assumed that torque is not an explicit function of RPM. This is only a first approximation because as the RPM of the motor goes up, the back emf increases and sets an effective limit to the drive current.

The first estimate of the rotor diameters $R_{max}$ and $R_{min}$ emerges from the following relationships.

$n_r = (2\pi R_{min} - 2dn_s)/d$ $L_{rc} = n_r (R_{max} - R_{min})$

Where $L_{rc}$=rotor coil wire length in air gap, $n_r$=number of radial traverses of the rotor coil across all the rotor segments, $R_{min}$=inner radius of the rotor coil thriller (75 mm), $R_{max}$=outer radius of the rotor coil former (125 mm), d diameter of copper magnet wire used for the rotor coil (1.7 mm), and $n_s$=number of subdivided sectors of the rotor former (in this case 10).

One me calculate as a first iteration the length $L_{rc}$ of the rotor coil wire in the air gap as follows:

$L_{rc} = T/(B_g \cdot I_{rc} \cdot <R>)$

If T=178.0 Nm design torque required, $B_g$=1.5 T, $I_{rc}$=25 A chosen peak rotor coil current, and $<R>=(R_{max}+R_{min})/2$=0.1 m is set by design estimate above, then $L_{rc}$=47.5 m rotor coil length is estimated to give 250 HP at 10,000 RPM.

These estimates can then be input into as static magnet finite element design software program to confirm the air gap magnetic flux densities and coil resistances. In particular the initial core area=$\pi(R_{max}^2 - R_{max}^2)$ is preserved as described earlier and repeated below with the altered dimensional parameters.

FIG. 9B is a simulation of flux lines of the PCMS rotational motor 122 shown in FIG. 9A. FIG. 9C is a simulation of flux lines of the rotor 124 section of the PCMS rotational motor shown in FIG. 9A. The flux free coil return cages 126 are shown schematically circumferential, but are actually radial. The rotor 124 comprises the top plates R1 and R4 128 and the rotor coil formers R2 and R3 130 which are all fabricated in SMC ArcoLam 2FHR.

In order to conserve material and maintain an approximately uniform magnetic flux density within the pot core magnet structure 132 along the magnet circuit length, the cross sectional area perpendicular to the lines of flux should remain constant. This can be achieved by ensuring that $r_r/h_1 = r_2/h_2 = r_x/h_x$ where r is radius and h is height of contiguous structure as shown in FIGS. 9A and 9B. Starting from desired rotor 124 coil inner and outer radii $R_{min}$ and $R_{max}$, the optimum geometry for minimum material is determined. The overall radius $r_x$ and height $h_x$ of the actuator is varied to give the desired field coil resistance $R_{fc}$ and inductance $L_{fc}$ within design weight limits. Finite element magnet method magnetics is used to optimize the geometry, generally for maximum Torque T.

The electronic circuitry required to drive the PCMS rotation motor 122 is identical in principle to that used to drive the ML-VCA and shown as a functional block diagram in FIG. 7. However the high rotational speeds will produce large hack EMFs that must be overcome by high voltages to drive the necessary current. This may mean that the H-Bridge networks shown on chip are likely to be higher voltage discrete devices with both the MOSFETs and their drivers off chip.

The primary drawback of the PCMS rotational motor 122 design is that the rotor needs to be electrically driven. In general this means one needs slip rings and brushes to transfer the high currents into the rotating rotor coil. Though there has been much improvement in slip ring design, this requirement is a drawback compared to modern electric machines, which generally avoid brushes and slip rings by using permanent rare earth NdFeB magnets in their rotors. The answer to this problem for the PCMS motor lies in using one of two classes of remote power deliver systems which can deliver power to rotating machinery by either inductive non-contact coupling using a rotating transformer or capacitive coupling using non-contact rotating interleaved capacitor plates.

The rotational motor described is magnet-less and consequently the requirement for brushes or slip rings with a radially wound rotor can be considered a disadvantage. If a permanent magnet is used instead of the field coil in the pot core magnet structure then the pot core magnet structure may serve as the rotor of an efficient brushless linear response DC motor with the radially wound coil serving as the stator.

FIG. 9D is a graph showing the magnetic flux density in the rotor coil gap ($B_g$/Tesla) vs. length in mm from points A to B as shown in FIG. 9C.

FIG. 10A is a plan view of a PCMS motor rotor coil termer 130. It is the plan view of R2 and R3 rotor former. The two-layer coil is wound radially in section P×10 and then return through the flux free coil return cages Q×10.

FIG. 10B is a top view of a top rotor coil former 130 with close pack winding 144 showing return wiring path through three of the ten flux free cages 126 to ensure unidirectional radial winding within the air gap.

Two examples of the brushless pot core motor are shown in FIG. 11. FIG. 11A is a half axial view of a simulation of flux lines of a brushless pot core motor using ceramic permanent ring magnet 146. In the low energy ceramic ring magnet configuration, the cross-sectional area of the pot core 150 is increased to provide additional flux in the air gap. The rotor is the pot core magnet structure, which rotates about fixed radially wound stator. FIG, 11B is a graph of a simulation of air gap magnetic flux density of the brushless pot core motor 146 using ceramic permanent ring magnet in FIG. 11A.

FIG. 11C is a half axial view of as simulation of flux lines of a brushless pot core motor using rare earth NdFeB permanent ring magnet 148. It can be seen that considerably less magnet material of pot core structure 152 is required to achieve comparable or greater flux density in the radial coil air gap. FIG. 11D is a graph of a simulation of air gap magnetic flux density of the brushless pot core motor 148 using rare earth NdFeB permanent ring magnet in FIG. 11C.

The examples of the pot core motors described herein are efficient and compact and lend themselves to automotive and other vehicle drive trains. In particular their linear response with constant torque at low RPM lends itself to compact, gearless, all-wheel drive, electric vehicle drive trains. In particular the radially wound segments, ten in the examples given but typically varying from between six and twenty four, can be individually driven by separate electronics drivers in parallel such that individual segments may be turned off or kept in generator only mode to save energy. This has the additional benefit of reducing the voltage drive requirements of the system by the number of segments. In other words the radial coil segments may be run in parallel rather than series.

In the case of an all-wheel drive vehicle drive motor it is even possible to use the pot core flux in dual rotation and vibration mode. In other words, a voice coil actuator as described herein is added to the rotation motor in the same pot core magnet structure. The voice coil then can then be directly attached to a hydraulic system to create a vibration force perpendicular to the axis of rotation. This force can be electronically controlled to provide active damping to the spring mounted motor directly attached to the drive wheel.

Because the motor design is a linear response DC rotation motor it should be clear that all the examples given above may be reversed such that components described therein act as efficient electric generators not just for recycling motor energy but in their own right. And the electric generator induced voltage at any given RPM is exactly the Back EMF ($V_{back}$) to be overcome by the motor drive mode and given by Lenz's law:

$V_{back} = d\phi/dt$ where $\phi = B_g A_{rc}$ is the magnetic flux swept through area $A_{rc} = L_{rc} 2\pi <R>$ at the RPM frequency. In the motor example given above this would be typically given by:

$V_{back} = B_g \cdot L_{rc} \cdot 2\pi <R> \cdot f_r$

Where:
$B_g$=Airgap flux density=1.0 T
$L_{rc}$=Total length of the rotor coil in the air gap=47.5 m
$f_r$=10,000 RPM=167 Hz
$<R>$=0.1 m
$V_{back}$=4.984 KV In the case where the ten rotor segments are wired in parallel this back EMF would be reduced to about 500V to achieve 10,000 RPM and hence 250 HP.

This doubly fed pot core magnet structure rotational motor 122 generally improves on the performance of existing motors for vehicular drive trains in a number of respects, The linear response direct drive which conies about by choice of SMC core material having minimum hysteresis and eddy current losses provides high torque at all RPMs within the design range. The torque estimate is highly parametric, and may be estimated and simulated statically. The control system $F(t)=H(t) \cdot G(t)$ used for magnet-less voice coil actuator (ML VCA) ports directly to the rotational motor. In principle the motor may be driven by variable DC but switch mode drive is very efficient using PWM class-D type drive with in general both channels H(t) and G(t) single ended drive and capable of recirculating energy. The design facilitates easy regenerative braking and energy recirculation using bidirectional semiconductor switches. The pot core magnet structure makes the most efficient use of magnetic energy when the air gap is fully utilized. This design the air gap is near 100% copper. Ferrofluid lubrication is used to minimize the reluctance of the air gaps used to allow rotation. The PCMS rotational motor is compact and readily lends itself to electrical braking and regenerative energy recirculation with little additional circuitry. These features are ideal for all wheel drive systems where the four drive wheels are in effect PCMS motors computer controlled and driven by wire.

The methodology for these other motors as shown with loudspeakers is scalable to virtually any size within the mechanical properties of the materials and in particular very large horsepower linearly controllable rotating motors are feasible for vehicular drivetrains with the possibility of seamless re-circulating braking energy.

Another application of the present invention 10 is in an electric piston engine. The pistons of a typical internal combustion (piston) engine are replaced by magnet-less voice coil actuators (ML-VCAs) driving a crank shaft(s) with one or more ML-VCAs inline vertical, flat horizontal or V format. Many of the prior art and traditional designs internal combustion piston engines are leveraged because of the similar form factor including, oil lubrication and cooling with enhancements using ferrofluid lubricants, water pumps and cooling systems allowing high RPMs because the electric motors dissipates less heat and not least, the familiarity of the form factor with the massive garage maintenance infrastructure. In effect the ICE pistons and cylinder head and fuel system is replaced by replaced by an array of compact ML-VCAs.

The PCMS rotation motor's primary drawback is that it requires slip rings, brushes or other means to feed electric power into the rotor, be that the field coil or radial coil. In the case described the radial coil is broken into ten segments separately driven in parallel to reduce the operating voltage from about 7.5 KV to 750 V and it makes sense for this to be the stator and use the field coil as the rotor as this only needs one power source. Inductive power transfer (IPT) and capacitive power transfer (CPT) may be used but this is complex, expensive and even the very best systems do not exceed 85% to 90% power transfer. A Metamaterial transformer structure which is a high pass transmission line comprising series capacitor and parallel inductor elements can provide non contact power transfer to the power level required and at efficiencies exceeding 95% but these devices are still in development for the most part.

Another alternative for the example of the rotational motor given here is to drive the rotor or voice col inductively. In effect the rotor field coil or moving voice coil is passively shorted and the changing current in the multi segment stator or MK-VCA field coil induces currents in the field coil rotor or moving voice coil, which by Lenz's law cause a torque or force and hence rotation or vibration. However this defeats the main power and efficiency advantage of the doubly fed electric motor systems described here. In cases where the power is sufficient from inductive motor version then the geometry, materials and electronics drive benefits of the electric motor systems described here can be leveraged to create induction motors which do not need slip rings, brushes, or the complexities of IPT or CPT.

The ML-VCA described here is doubly fed with controlled power to both the voice coil and the field coil and the vibration action means that power can very easily be fed to the moving voice coil by a simple flexible conductor, say braided copper wire, which can tolerate the maximum displacements of the system. This is very standard in loudspeaker motors which at most have peak to peak displacements of about 1 mm for micro speakers to about 25 mm few very large speakers, particularly those used at low frequencies, sub woofers, where the volume of air displacement is large. But there is no reason why this direct feed through braided or other flexible conductor cannot be extended to 100 mm or more.

It is proposed here that there would be several advantages if the pistons of a conventional Internal Combustion (Piston) Engine were to be replaced by ML-VCA, typically one for each piston to create the Electric Piston Engine (EPE) driven by Electric Piston Motors (EPM). The main difference between this piston motor application of the ML-VCA compared to the loudspeaker application proposed above is that the maximum frequency in this embodiment would be 200 Hz (12000 RPM) and more commonly 125 Hz (7500 RPM) for EPE ML-VCAs compared to 1000 Hz to 2500 Hz even for the very largest 12 in to 18 in loudspeakers. This means that the effects of high accelerations experienced in loudspeaker motors such as very low moving mass for the voice coil are not relevant. For example the voice coil may be clad in very thin high strength magnetically soft stainless steel and ferrofluid used as described above as lubricant. This means that the air gaps and loss of flux can be minimized.

The electronic drive scheme proposed for loudspeaker use is no different other than the frequencies involve are lower by two orders of magnitude. However as can be seen from the analysis below, the voltages and currents are much higher. The electronic circuits with PWM methods are identical but high voltage devices particularly MOSFETs are required. IGBTs may be used with freewheeling diodes to facilitate energy recirculation by the generator action (Back EMF), called Regen in the electric vehicle industry. Having multiple motors that can operate independently as a motor or generator or off helps manage Regen.

This doubly fed Electric Piston Engine generally improves on the performance of existing Internal Combustion (Piston) Engines as well as Electric Rotation Motor Engines for vehicular drive trains in as number of respects. The linear response direct drive which comes about by choice of SMC core material having minimum hysteresis and eddy current losses provides high torque at all RPMs within the design range. The torque estimate is highly parametric and may be estimated and simulated statically. The control system $F(t)=H(t).G(t)$ used for ML VCA ports directly to the rotational motor. In principle the motor may be driven by variable DC for the field coil and AC in phase with rotation but switch mode drive is very efficient using PWM class-D type capable of recirculating enemy using MOSFETs or IGBTs (with freewheeling diodes).

The design facilitates easy regenerative braking and energy recirculation using bidirectional semiconductor switches. The pot core magnet structure makes the most efficient use of magnetic energy when the air gap is fully utilized. In this design the air gap is near 100% copper. Ferrofluid lubrication is used to minimize the reluctance of the air gaps used to allow vibration of the voice coil. The PCMS rotational motor is compact and readily lends itself to electrical braking and regenerative energy recirculation with little additional circuitry required. These features are ideal for all wheel drive systems where the four drive wheels are in effect PCMS motors computer controlled and driven by wire. Much of the prior art for traditional internal combustion piston engines is leveraged because of the similar form factor including, oil lubrication and cooling with enhancements using ferrofluid lubricants, water pumps and cooling systems allowing high revs because the electric motors dissipates less heat and not least, the familiarity of the form factor with the massive garage maintenance infrastructure.

The Electric Piston Engine (EPE) described above lends itself to at hybrid engine with both ML-VCAs combustion piston motors driving a common crankshaft. Lubrication and cooling systems can be shared and the system is ideally suited to Regen.

The 4stroke ICE only delivers power on the combustion stroke of the engine Whereas the ML-VCA delivers power on all for cycles when it is on a shared crankshaft so fewer cylinders need to be engaged. In fact a single cylinder ML-VCA EPE is quite feasible. A typical 6 cylinder system would run say 4 conventional internal combustion piston cylinder and the other 2 would be operated by ML-VCAs. The design would be little different from the one shown above with the ML-VCA delivering say 250 HP and the 4 cylinders ICE delivering also 250 HP.

The lubrication system could be shared as conventional synthetic oils could operate in the ML-VCAs. Ferrofluids have also been considered as lubricants for conventional engines and it would be possible to have a common lubricant and oil pump.

In an alternative embodiment of the invention, the invention comprises a magnet-less electromagnetic voice coil actuator comprising: a pot core magnet structure comprising a soft magnetic core made from an insulated powdered iron soft magnetic composite; a field coil within the pot core magnetic structure creating an air gap; and a voice coil suspended within the air gap. Optionally, the number of turns of the field coil may be maximized to increase magnetic flux density in the air gap, the field coil within the pot core magnet structure may form a stationary electromagnet, and the pot core magnet structure may provide an efficient magnet circuit with low stray field loss.

In another embodiment, the system comprises a magnet-less electromagnetic voice coil actuator comprising: a pot core magnet structure having a magnetic flux conductive core; a field coil within the pot core magnet structure for generating magnetic flux lines through the magnetic flux conductive core and across an air gap; and as voice coil wound on a voice coil former forming an under-hung voice coil design within the air gap; whereby the voice coil and the field coil are each driven by an amplified signal derived from an audio input signal to create an actuation force. Optionally, the voice coil former may be fabricated using a polyamide film, and optionally the voice coil former may be suspended at a lower end by a resin impregnated cloth spider of high compliance suspension and an upper end is attached to a central part of a circular light stiff composite flat panel, wherein the circular light stiff composite flat may be suspended at an edge by a rubber roll-surround suspension, and wherein the resin impregnated cloth 'spider' and the rubber roll-surround suspension may restrict the motion of the circular light stiff composite flat panel in an x-y plane to allow free motion with a well-defined compliance along z-axis. The circular light stiff composite flat panel may be suspended at an edge by a rubber roll-surround suspension.

Still further optionally, the field coil may be driven by the amplified audio signal and the amplified audio signal may be a positive definite function of the audio input signal, the positive definite function of the audio input signal may be low level limited to minimize quiescent power dissipation of the magnet-less electromagnetic voice coil actuator. The positive definite function of the audio signal may also he bandwidth limited within a limit set by the inductance of the field coil, and further may be peak limited to achieve a design targeted air gap flux density. 1. In still further embodiments, the magnet-less voice coil actual described above may comprise a pot core magnet structure that uses a soft magnet core fabricated by press molding a soft magnetic. composite (SMC). The soft magnetic composite (SMC) may be an insulated powder metal ArcoLam 2FHR In the magnet-loss voice coil actual described above, the voice coil may be made from copper clad aluminum wire, and further the field coil may generate magnetic energy by passing the amplified audio signal and provide efficient recirculation of magnetic energy stored in the air gap.

In another embodiment, the system comprises a magnetless electromagnetic voice coil actuator comprising: a pot core magnet structure comprising a soli magnetic flux conductive core made from an insulated powdered iron soft magnetic composite material; a field coil forming a stationary electromagnet, generating magnetic flux lines through the soft magnetic flux conductive core and across an air gap; and a voice coil wound on as voice coil former forming an under-hung voice coil design suspended within the air gap. The voice coil and the field coil may be independently driven by an amplified audio signal derived from an audio input signal. The voice coil and the field coil may carry separate amplified audio signals from a pulse width modulated (PWM) Class-D amplifier. The audio input signal F(t) may he a bipolar audio signal, the bipolar audio signal may he split into separate amplified audio signals including a positive definite field coil signal H(t) and a bipolar voice coil signal G(t). Optionally, the positive definite field coil signal H(t) may he directed to and actuate the field coil of the pot core magnet structure and the bipolar voice coil signal G(t) may be directed to and actuates the voice coil.

Optionally, the audio input signal F(t) may be reproduced into sound emanating from the magnet-less electromagnetic voice coil actuator, and the voice coil may generate a magnetic field in response to the bipolar voice coil signal G(t) and the pot core magnet structure may generate a second magnetic field in response to the positive definite field coil signal H(t), wherein the magnetic fields interacts and causes the voice coil to move to reproduce the audio input signal F(t) into sound.

In another embodiment, the system comprises a magnetless electromagnetic voice coil actuator comprising: a pot core magnet structure made from an insulated powdered iron soft magnetic composite; a field coil actuated by a positive definite field coil signal H(t) generating a magnetic field across an air gap; a voice coil wound on a voice coil thriller and suspended within the air gap, the voice coil being actuated by a bipolar voice coil signal G(t); and an electronic signal processor configured to calibrate magnetic flux density ($B_g$) at the air gap by measuring magnetic field induced in the voice coil when the field coil is stimulated with a known test pattern of a field coil current signal. The audio input signal F(t) may be an input differential signal, and the input differential signal may be AC coupled and amplified by differential amplifier module. The differential output from the differential amplifier module may be fed to a CODEC and the electronic signal processor.

Optionally, the electronic signal processor may be integrated onto an integrated circuit, the electronic signal processor may generates the positive definite field coil signal H(t) and the bipolar voice coil signal G(t) from the audio input signal F(t). Further, the electronic signal processor may provide a linear response of an actuation force in both amplitude and frequency to the audio input signal F(t) having bandwidth from DC to 20 KHz, and the audio input signal F(t) may be a time dependent audio electrical signal, which in turn may be processed and partitioned into an amplified voice coil current signal G(t) and a field cod current signal H(t). The field coil current signal H(t) may be bandwidth limited by a plurality of bandwidth limiting filter to achieve a target air gap magnetic flux density ($B_g$) at a designated peak field coil current signal H(t), and the field coil current signal H(t) may be bandwidth limited by a plurality of bandwidth limiting filters to frequencies less than the time dependent audio electrical signal F(t), with the bandwidth limited frequencies based at least in part on the calibration. The. amplified voice coil current signal G(t) may be processed to complement a bandwidth limited field coil current signal H(t) and the bandwidth limited field coil current signal H(t) and the amplified voice coil current signal G(t) may provide a Lorentz force on the voice coil. Optionally, the Lorentz force on the voice may provide a faithful amplified representation of the audio input signal F(t)=G(t).H(t).

Still further optionally, the magnet-less electromagnetic voice coil actuator may further comprise time delay compensation wherein the time delay compensation is made for any group time delays introduced by the plurality of bandwidth limiting filters. Here, a positive group delay time adjustment may be made with the bandwidth limited field coil current signal H(t) and negative group delay time adjustments may be made with the amplified voice coil current signal G(t).

Still further optionally, the electronic signal processor perform may perform calibration by operating the voice coil into a search coil transducer to calibrate the air gap magnetic flux density ($B_g$) by measuring magnetic field induced in the voice coil when the field coil is stimulated with the known test pattern of the field coil current signal. Calibration may also be performed by to accurately determine time delay of a plurality of signals processed through the field coil relative to the signals through the voice coil. The electronic signal processor may also perform a calibration to determine bandwidth of the field coil current signal H(t) when processed through the field coil to apply proper compensation to the voice coil current signal G(t) to recover full bandwidth of the audio input signal F(t).

In another embodiment, the system comprises a magnetless electromagnetic voice coil actuator comprising: a pot core magnet structure made from an insulated powdered iron soil magnetic composite; an electronic signal processor configured to split an audio input signal F(t) into a positive definite field coil signal H(t) and a bipolar voice coil signal G(t); a field coil actuated by the positive definite field coil signal H(t) generating magnetic flux lines across an air gap; and as voice coil wound on a voice coil former and suspended within the air gap, the voice coil being actuated by the bipolar voice coil signal G(t).

Optionally, the positive definite field coil signal H(t) and the bipolar voice coil signal G(t) are not synchronous in time or have different respective signal group time delays, wherein the group time delays may he dependent on respective impedances of the field coil and the voice coil. Still further optionally, the positive definite field coil signal H(t) may be directed to and actuates the pot core magnet structure and the bipolar voice coil signal G(t) may be directed to and actuates the voice coil for reproducing the audio input signal F(t) into sound emanating from the magnet-less electromagnetic voice coil actuator.

In another embodiment, the system comprises a magnetless electromagnetic voice coil actuator comprising: a pot core magnet structure comprising a soft magnetic flux conductive core made from an insulated powdered iron soft magnetic composite; a field coil positioned within the pot core magnet structure creating magnetic field through the soft magnetic flux conductive core and across an air gap; a voice coil wound on a voice coil former providing an under-hung voice coil design suspended within the air gap and an electronic signal processor configured to use negative feedback to linearize an actuation force to achieve a faithful representation of an audio input signal F(t). In alternative embodiments the electronic signal processor may configured to split the audio input signal F(t) into a positive definite field, coil signal H(t) and a bipolar voice coil signal G(t); the positive definite field coil signal H(t) and the bipolar voice coil signal G(t) may be fed into a feedback error amplifier module.

In still further embodiments the electronic signal processor gathers feedback from at least one sensor selected from an optical sensor, a magnetic sensor, a piezo sensor, a Micro-Electro-Mechanical Systems (MEMS) sensor, an accelerometer and a transducer to provide time dependent voice coil displacement information to correct an output of the magnet-less electromagnetic voice coil actuator. Optionally, the electronic signal processor uses feedback from at least one sensor selected from a transducer sensor, a Hall Effect sensor and a search coil magnetic field sensor to receive time dependent and/or static information on the voice coil air gap magnetic flux density (B.sub.g). The electronic signal processor may compare the feedback to the audio input signal F(t) to adjust the voice coil signal G(t) and/or the field coil signal H(t) in real time to achieve a faithful representation of the audio input signal F(t), and finally the electronic signal processor may compare the feedback to a required field coil signal H(t) to adjust the field coil signal H(t) to ensure that the air gap magnetic flux density B.sub.g is linearly related to the positive definite field coil signal H(t).

In certain embodiments of the magnet-less electromagnetic voice coil actuator, the feedback error amplifier module monitors voltage feedback from an output of the electronic signal processor, current feedback from the output of the electronic signal processor, and/or a transducer sensor output feedback for signal correction. In still other embodiments the feedback error amplifier module produces differential outputs H(t) that are fed to a pulse width modulator (PWM) module to generate a plurality of pulse width modulated (PWM) outputs corresponding to the positive definite field coil signal H(t) and the bipolar voice coil signal G(t). The feedback error amplifier module optionally receives motion sensor feedback to linearize and correct a time dependent voice coil actuator displacement by altering a voice coil current generated by the bipolar voice coil signal G(t), and finally the feedback error amplifier module may receive magnetic sensor feedback to linearize and correct a voice coil air gap magnetic flux density ($B_g$) by altering a field coil current generated by the positive definite field coil signal H(t).

In another embodiment, the system comprises a pot core magnet structure rotational motor comprising a pot core magnet structure comprising a soft magnetic composite and having an air gap; a field coil positioned within the pot core magnet structure; a rotor, passing through the air gap, comprising a magnet wire radially wound with a plurality of flux free coil return cages; and a ferrofluid lubricated interface between the rotor and the pot core magnet structure. In further alternative embodiments the pot core magnet structure rotational motor may comprise top plates and rotor coil formers comprising, the soft magnetic composite, the soft magnetic composite may be ArcoLam 2FHR, and the ferrofluid may used to minimize reluctance of the air gap used to allow rotation.

In another embodiment, the system comprises a magnet-less electromagnetic voice coil actuator comprising: a pot core magnet structure comprising a soft magnetic flux conductive core made from an insulated powdered iron soft magnetic composite; a field coil positioned within the pot core magnet structure creating magnetic flux through the so magnetic flux conductive core and across an air gap; and a voice coil wound on a voice coil former providing an under-hung voice coil design suspended within the air gap. Optionally, the air gap stores magnetic energy generated by the field coil and is re-circulated between the voice coil and a plurality of voltage rail reservoir capacitors. Optionally, the plurality of voltage rail reservoir capacitors isolates and provides storage to facilitate recirculation of as field coil current. Finally, the voice coil and field coil may comprise materials including aluminum and/or copper clad aluminum magnet wire to reduce weight.

In another embodiment, the system comprises a magnet-less electromagnetic voice coil actuator comprising: an electronic signal processor configured to split an audio input signal F(t) into a positive definite field coil signal H(t) and a bipolar voice coil signal G(t); a field coil actuated by the positive definite field coil signal H(t) generating magnetic field across an air gap; and a voice coil wound on as voice coil former and suspended within the air gap, the voice coil being actuated by the bipolar voice coil signal G(t). Optionally, the electronic signal processing module enables transfer of the audio input signal F(t) into dual signals form including the positive definite field coil signal H(t) and the bipolar voice coil signal G(t), and wherein the signal group delays may be embedded in an audio output signal and not easily extracted.

In another embodiment, the system comprises a magnet-less electromagnetic voice coil actuator comprising; a pot core magnet structure made from an insulated powdered iron soft magnetic composite; an electronic signal processor configured to split an audio input signal F(t) into a positive definite field coil signal H(t) and a bipolar voice coil signal G(t); a pulse width modulated (PWM) Class-D amplifier for driving the field coil; a field coil actuated by the positive definite field coil signal H(t) generating magnetic flux lines across an air gap; as voice coil wound on a voice coil thriller and. suspended within the air gap, the voice coil being actuated by the bipolar voice coil signal G(t); a pulse width modulated (PWM) Class-D amplifier for driving the voice coil; and a pulse width modulated (PWM) Class-D amplifier tear driving the field coil. Optionally, either in combination or alone, the audio input signal F(t) is amplified using the pulse width modulated (PWM) Class-D amplifier, the positive definite field coil signal H(t) is driven directly by the pulse width modulated class-D amplifier, and the air gap stores magnetic energy and is re-circulated between a field coil inductances and a plurality of voltage rail reservoir capacitors.

In another embodiment, the system comprises a magnet-less electromagnetic voice coil actuator comprising: a pot core magnet structure made from an insulated powdered iron soft magnetic composite; an electronic signal processor configured to split an audio input signal F(t) into a positive definite field coil signal H(t) and a bipolar voice coil signal G(t); a field coil positioned within the pot core magnet structure generating magnetic flux lines across an air gap by conducting the positive definite field coil signal H(t); and a voice coil actuated by the bipolar voice coil signal G(t). The voice coil may generate a magnetic field in response to the bipolar voice coil signal G(t), the field coil within the pot core magnet structure may generate a magnetic field in response to the positive definite field coil signal H(t). Further the magnetic field by the field coil may be generated by conducting the positive definite field coil signal H(t) so it interacts with the magnetic field generated by the voice coil and causes the voice coil to move to vibrate a diaphragm. Finally, the audio input signal F(t) may be reproduced into sound emanating from the magnet-less electromagnetic voice coil actuator.

To minimize the limitations found in the prior art, and to minimize other limitations that win be apparent upon the reading of the specification, some examples of the present invention may provide a voice coil actuator device that eliminates the use of permanent magnets and uses a low cost iron electromagnet structure.

Some examples of the present invention may provide a magnet-less electromagnetic voice coil actuator that may be used as the voice coil actuator for all loudspeaker driver topologies and at scales from micro-speakers with typically 10 mm diameter diaphragms to Public Address & Rock Concert loud speakers with typically 18 in (450 mm) diameter diaphragms. In some examples, the device functions by replacing the expensive permanent magnet used in current loudspeakers with an electromagnet formed from a high turns field coil in a pot core magnet structure made with a low eddy current loss and low hysteresis loss soft magnet core. The voice coil and field coil are efficiently driven by separate amplified signals derived from the audio input signal so that the actuation force of the voice coil actuator is a linear function of the audio input signal.

In some examples of the present invention, the device may provide a magnet-less electromagnetic voice coil actuator with high flux density voice coil air gap created by an electromagnet with field coil in a pot core magnet structure which uses a soft magnet core made from low cost insulated powdered iron soft magnet composite (SMC) material optimized fur low losses at audio operational frequencies from DC to in excess of 25 KHz, The geometry of the pot core magnet structure ensures efficient magnet circuitry with minimum stray field loss. Notwithstanding its high coil inductance and mass, the number of turns on the stationary field coil is maximized to create an air gap with large magnetic flux density while the voice coil length is optimized to minimize the voice coil moving mass and inductance. Because the voice coil air gap magnet flux density approximates a linear function of field coil current over the range of interest, the actuation force (Lorentz Force) is a linear function of the product of the voice coil current and field coil current.

In some examples, the electromagnet energizing field coil current may not he DC as in prior art electromagnet voice coil actuators but instead is a carefully chosen positive definite function of the audio input which is bandwidth limited within a limit set by the high inductance of the field coil, peak limited to level to ensure the design targeted air gap flux density is achieved, and low level limited to minimize quiescent power dissipation of the system. The voice coil current is adjusted so that the product of the bandwidth limited positive definite field coil current and the bipolar voice cod current, hence the actuation force, is a linear function of the bipolar audio input current. For the highest levels of electrical efficiency, the positive definite field coil current is driven b a single ended pulse width modulator (PWM) or class-D amplifier and the bipolar voice coil current is driven by a differential or bridge tied load (BTL) class-D amplifier. In addition the field coil current is made to recirculate between the field coil inductance and voltage rail reservoir capacitors minimizing ohmic energy losses by using low field coil resistance $R_{fc}$ and MOSFETs with low $R_{DS(ON)}$.

In some examples, the present invention may provide an efficient magnet circuit with low magnet flux loss from stray fields using a pot core magnet structure geometry for the voice coil actuator's electromagnet. In some examples, the present invention may use Soft Magnetic Composites (SMC) material for the pot core magnet structure that has a Ferromagnetic response similar to Super paramagnetic behavior with a near linear response to the input audio or other actuating signal, low eddy current and hysteresis losses in the electromagnet structure and AC operation from DC to 20 kHz or other designated frequency limit.

In some examples of the present invention, electronic signal processing may he used that gives a linear response of the actuation force in both amplitude and frequency to the incoming audio signal and which has a bandwidth from DC to 20 KHz. An incoming audio signal F(t) is split into two separate audio signals H(t) and G(t) by a signal processor. H(t) is directed to and actuates the field coil and G(t) is directed to and actuates the voice coil such that audio signal F(t) is reproduced as sound emanating from the magnet-less voice coil actuator. The voice coil may used as a search coil transducer to calibrate the air gap magnetic flux density $B_g$ by measuring the magnetic field induced in the voice coil when the field coil is stimulated with a known test pattern field coil current $I_{fc}$. This calibration can be used at the time of manufacture and or periodically during use to compensate for component ageing by auto calibration on start up. The signal processing uses negative feedback to linearize the actuation force so that it is a faithful representation of the incoming audio signal.

In some examples of the present invention, efficient electronic amplification of audio signals ma be provided using PWM Class-D amplifiers for driving both the voice coil and field coil. The magnetic energy generated by the field coil is efficiently recirculated and stored in the voice coil air gap. Weight reduction may be achieved through the device's use of an aluminum field coil magnet wire. The device provides a method to integrate the magnet-less voice coil actuator with the electronic integrated circuits to provide a loudspeaker drive motor which can receive low level analog or digital noise free audio signals and power.

In some examples, the present invention may provide a method to extend the axisymmetric topology from a circular to as racetrack topology where the cross sections appear identical to those given herein but the voice coil, field coil and pot core magnetic structure takes on a high aspect ratio of more than about 2:1 to say 10:1. It also discloses a way to extend the magnet-less methodology to other voice coil actuator topologies with linear motion and permanent magnet motors with rotational motion. Further, the device provides encryption of copyrighted and other high-resolution audio works of art to bridge the so-called analog hole or analog loophole, which has thus far been considered impossible to circumvent in audio. This is made possible in some examples of this invention because the dual signal transfer using F(t)=H(t).G(t) can effectively mask the original work of F(t) right up to the acoustic output.

In some examples, it may he an objective of the present invention to provide a voice coil actuator device which eliminates the use of permanent magnets and uses a low cost iron electromagnet structure.

In some examples, it may he an objective of the present invention to provide a voice coil actuator device with an integrated amplifier and field coil driver.

In some examples, it may be an objective of the present invention to provide a voice coil actuator device that when integrated with loudspeaker drivers is as electrically efficient as today's class-D amplifiers, such as the MAX98400B, when driving contemporary loudspeaker drivers.

In some examples, it may he an objective of the present invention to provide an efficient magnet circuit with low magnet flux loss from stray fields using a pot core magnet structure geometry for the voice coil actuator's electromagnet.

In some examples, it may he an objective of the present invention to provide a device that uses Soft Magnetic Composites (SMC) material for the pot core magnet structure that has Super paramagnetic behavior with a near linear response to the input audio or other actuating signal, low eddy current losses in the electromagnet structure and AC operation from DC to 20 KHz or other designated frequency limit.

In some examples, it may he an objective of the present invention to provide electronics signal processing that gives a linear response of the actuation three in both amplitude and frequency to the incoming audio signal and that has a bandwidth from DC to 20 KHz.

In some examples, it may be an objective of the present invention to provide signal processing that uses the voice coil as at search coil transducer to calibrate the air gap magnetic flux density $B_g$.

In some examples, it may he an objective of the present invention to provide a signal processing that uses negative feedback to linearize the actuation force so that it is a faithful representation of the incoming audio signal.

In some examples, it may be an objective of the present invention to provide efficient electronics amplification of audio signals using PWM Class-D amplifiers for driving both the voice coil and field coil.

In some examples, it may be an objective of the present invention to provide efficient recirculation of the magnetic energy generated by the field coil and stored in the voice coil air gap.

In some examples, it may be an objective of the present invention to provide weight reduction.

In some examples, it may he an objective of the present invention to integrate the magnet-less voice coil actuator with the electronic integrated circuits to provide a loudspeaker drive motor which can receive low level analog or digital noise free audio signals and power.

In some examples, it may he an objective of the presents invention to extend the axisymmetric topology from a circular to a racetrack topology where the cross sections appear identical to those given herein but the voice coil, field coil and pot core magnetic structure takes on a high aspect ratio.

In some examples, it may be an objective of the present invention to extend the magnet-less methodology to other voice coil actuator topologies with linear motion and permanent magnet motors with rotational motion.

In some examples, it may be an objective of the present invention is provide a method of encrypting copyrighted and other high resolution audio works of art to bridge the called analog hole or analog loophole which has thus far been considered impossible to circumvent in audio.

The foregoing description of the preferred embodiment of the present invention boas been presented for the purpose of illustration and description. It is not intended to he exhaustive or to limit the invention to the precise form disclosed. Many modifications and variations are possible in light of the above teachings. It is intended that the scope of the present invention not be limited by this detailed description, but by the claims and the equivalents to the claims appended hereto.

I claim:

1. An electromagnetic voice coil actuator, comprising:
 a pot core magnet structure having a magnetic flux conductive core;
 a field coil within the pot core magnet structure for generating magnetic flux lines through the magnetic flux conductive core and across an air gap; and
 a voice coil disposed within the air gap,
  wherein the voice coil and the field coil are each driven by an amplified signal derived from an audio input signal to create an actuation force,
  wherein the pot core magnet structure uses a soft magnet core; and
  wherein the audio input signal is amplified using a pulse width modulated (PWM) amplifier to derive the amplified signal to drive the voice coil and the field coil.

2. The electromagnetic voice coil actuator of claim 1, wherein the soft magnet core includes a molded soft magnetic composite (SMC).

3. The electromagnetic voice coil actuator of claim 2, wherein the soft magnet composite (SMC) is an insulated powdered iron soft magnet composite material optimized for low losses at audio operational frequencies.

4. The electromagnetic voice coil actuator of claim 2, wherein the soft magnetic composite (SMC) of the pot core magnet structure has superparamagnetic behavior with a near linear response to the audio input signal.

5. The electromagnetic voice coil actuator of claim 1, wherein the voice coil and the field coil are each driven by separate amplified signals derived from the audio input signal.

6. The electromagnetic voice coil actuator of claim 1, wherein the actuation force of the voice coil is substantially a linear function of the audio input signal.

7. The electromagnetic voice coil actuator of claim 1, wherein the field coil has a large number of turns to create an elevated magnetic flux density within the air gap.

8. The electromagnetic voice coil actuator of claim 1, wherein the voice coil has a length optimized to minimize a moving mass and an inductance of the voice coil.

9. The electromagnetic voice coil actuator of claim 1, wherein the amplified signal driving the field coil is bandwidth limited within a limit set by an inductance of the field coil.

10. An electromagnetic voice coil actuator, comprising:
 a pot core magnet structure having a magnetic flux conductive core;
 a field coil within the pot core magnet structure for generating magnetic flux lines through the magnetic flux conductive core and across an air gap; and
 a voice coil disposed within the air gap,
  wherein the voice coil and the field coil are each driven by an amplified signal derived from an audio input signal to create an actuation force;
  wherein the pot core magnet structure uses a soft magnet core;
  wherein the voice coil and the field coil are each driven by separate amplified signals derived from the audio input signal; and
  wherein the separate amplified signal driving the voice coil and the separate amplified signal driving the field coil effectively mask an original work of the audio input signal up to a point of acoustic output.

11. The electromagnetic voice coil actuator of claim 10, wherein the soft magnet core includes a molded soft magnetic composite (SMC).

12. The electromagnetic voice coil actuator of claim 11, wherein the soft magnet composite (SMC) is an insulated powdered iron soft magnet composite material optimized for low losses at audio operational frequencies.

13. The electromagnetic voice coil actuator of claim 11, wherein the soft magnetic composite (SMC) of the pot core magnet structure has superparamagnetic behavior with a near linear response to the audio input signal.

14. The electromagnetic voice coil actuator of claim 10, wherein the actuation force of the voice coil is substantially a linear function of the audio input signal.

15. The electromagnetic voice coil actuator of claim 10, wherein the field coil has a large number of turns to create an elevated magnetic flux density within the air gap.

16. The electromagnetic voice coil actuator of claim 10, wherein the voice coil has a length optimized to minimize a moving mass and an inductance of the voice coil.

17. The electromagnetic voice coil actuator of claim 10, wherein the amplified signal driving the field coil is bandwidth limited within a limit set by an inductance of the field coil.

18. An electromagnetic voice coil actuator, comprising:
an electronic signal processor configured to split an audio input signal into a first signal and a second signal;
a field coil actuated by the first signal generating a magnetic field across an air gap;
and a voice coil disposed within the air gap, the voice coil being actuated by the second signal.

19. The electromagnetic voice coil actuator of claim 18, wherein the audio input signal is obfuscated by being split into the first signal and the second signal.

20. The electromagnetic voice coil actuator of claim 18, wherein the first signal and the second signal are not synchronous in time and have distinct signal group delays associated with impedances of the field coil and the voice coil.

21. The electromagnetic voice coil actuator of claim 18, wherein the first signal and the second signal effectively masks an original work of the audio input signal up to a point of acoustic output.

22. The electromagnetic voice coil actuator of claim 18, wherein the first signal and the second signal are made part of an encryption scheme to prevent direct access to a high fidelity electronic node in an audio chain.

\* \* \* \* \*